United States Patent [19]

Jones et al.

[11] Patent Number: 5,537,360
[45] Date of Patent: Jul. 16, 1996

[54] PROGRAMMABLE POWER SUPPLY SYSTEMS AND METHODS PROVIDING A WRITE PROTECTED MEMORY HAVING MULTIPLE INTERFACE CAPABILITY

[75] Inventors: Brian W. Jones, Richardson; Alan M. Morton, Dallas, both of Tex.

[73] Assignee: Dallas Semiconductor Corporation, Dallas, Tex.

[21] Appl. No.: 308,462

[22] Filed: Sep. 16, 1994

[51] Int. Cl.$^6$ .................................................. G11C 7/00
[52] U.S. Cl. .................... 365/226; 365/195; 365/206; 307/43
[58] Field of Search ................................ 365/226, 228, 365/229, 195, 196, 206; 307/43, 126; 395/750

[56] References Cited

U.S. PATENT DOCUMENTS

| | | | |
|---|---|---|---|
| 3,673,576 | 6/1972 | Donaldson, Jr. | 340/172.5 |
| 3,895,239 | 7/1975 | Alaspa | 307/268 |
| 4,013,902 | 3/1977 | Payne | 307/268 |
| 4,034,348 | 7/1977 | Rathbun | 364/200 |
| 4,365,291 | 12/1982 | Zanchi et al. | 364/200 |
| 4,500,953 | 2/1985 | Takezoe et al. | 364/200 |
| 4,571,602 | 2/1986 | De Schamphelaere et al. | 346/160 |
| 4,571,603 | 2/1986 | Hornbeck et al. | 346/160 |
| 4,591,745 | 3/1986 | Shen | 307/592 |
| 4,612,632 | 9/1986 | Olson | 365/226 |
| 4,633,107 | 12/1986 | Norsworthy | 307/594 |
| 4,663,730 | 5/1987 | Ikeda | 364/900 |
| 4,670,676 | 6/1987 | Nishitani | 307/592 |
| 4,797,584 | 1/1989 | Aguti et al. | 307/594 |
| 4,812,679 | 3/1989 | Mahabadi | 307/272.1 |
| 4,818,904 | 4/1989 | Kobayashi et al. | 307/594 |
| 4,874,965 | 10/1989 | Campardo et al. | 307/272.3 |
| 4,885,476 | 12/1989 | Mahabadi | 307/272.3 |
| 4,886,984 | 12/1989 | Nakaoka | 307/272.3 |
| 4,900,950 | 2/1990 | Dubujet | 307/272.3 |
| 4,902,907 | 2/1990 | Haga et al. | 307/272.3 |
| 4,931,985 | 6/1990 | Glaise et al. | 364/900 |
| 4,953,077 | 8/1990 | Alvarez, II et al. | 364/200 |
| 4,970,418 | 11/1990 | Masterson | 307/480 |
| 4,975,883 | 12/1990 | Baker et al. | 365/226 |
| 5,019,966 | 5/1991 | Saito et al. | 364/200 |
| 5,081,701 | 1/1992 | Silver . | |
| 5,307,318 | 4/1994 | Nemoto | 365/226 |
| 5,349,669 | 9/1994 | Arai et al. | 365/226 |
| 5,357,458 | 10/1994 | Yu et al. | 365/226 |

OTHER PUBLICATIONS

Texas Instruments, *The TTL Data Book*, 1980–1981, 7–460 to 7–464.
Dallas Semiconductor, *Dallas Semiconductor Data Book*, DS1215, DS1217A and DS1217M, 1987–1988.

*Primary Examiner*—David C. Nelms
*Assistant Examiner*—Tan T. Nguyen
*Attorney, Agent, or Firm*—Jenkens & Gilchrist

[57] ABSTRACT

A programmable power controller controls power between a primary power source and a secondary power source and powering first circuitry. The primary power source has a first voltage and the secondary power source has a second voltage. A control register has a first field, which is field used to activate circuitry used to direct power from the primary power source to the secondary power source. First logic circuitry compares the first voltage and the second voltage to determine which is greater and then couples the primary power source or the secondary power source, depending upon which is greater, to power the first logic circuitry, second logic circuitry, and memory. The memory is coupled to the first logic circuitry and is read and written to via an input/output buffer. The second logic circuitry is coupled to the memory and to said first logic circuitry and activates write protection circuitry to prevent writing to the memory if the secondary power source is powering the first logic circuitry, the second logic circuitry, and the memory.

22 Claims, 13 Drawing Sheets

FIG. 11

| | |
|---|---|
| 00H | CLOCK/CALENDAR READ ADDRESSES ONLY |
| 1FH | |
| 20H | 96 BYTES USER RAM READ ADDRESSES ONLY |
| 7FH | |
| 80H | CLOCK/CALENDAR READ ADDRESSES ONLY |
| 9FH | |
| A0H | 96 BYTES USER RAM READ ADDRESSES ONLY |
| FFH | |

HEX ADDRESS

| READ | WRITE | BIT 7 | | | | | | BIT 0 | |
|---|---|---|---|---|---|---|---|---|---|
| 00H | 80H | 0 | 10 SEC | | | SEC | | | |
| 01H | 81H | 0 | 10 MIN | | | MIN | | | |
| 02H | 82H | 0 | 12/24 | 10 A/P | 10 HR | HOURS | | | |
| 03H | 83H | 0 | 0 | 0 | 0 | DAY | | | |
| 04H | 84H | 0 | 0 | 10 DATE | | DATE | | | |
| 05H | 85H | 0 | 0 | 10 MONTH | | MONTH | | | |
| 06H | 86H | 10 YEAR | | | | YEAR | | | |
| 07H | 87H | M | 10 SEC ALARM | | | SEC ALARM | | | ⎫ |
| 08H | 88H | M | 10 MIN ALARM | | | MIN ALARM | | ALARM 0 | |
| 09H | 89H | M | 12/24 | 10 A/P | 10 HA | HOUR ALARM | | | |
| 0AH | 8AH | M | 0 | 0 | 0 | DAY ALARM | | | ⎭ |
| 0BH | 8BH | M | 10 SEC ALARM | | | SEC ALARM | | | ⎫ |
| 0CH | 8CH | M | 10 MIN ALARM | | | MIN ALARM | | ALARM 1 | |
| 0DH | 8DH | M | 12/24 | 10 A/P | 10 HA | HOUR ALARM | | | |
| 0EH | 8EH | M | 0 | 0 | 0 | DAY ALARM | | | ⎭ |
| 0FH | 8FH | CONTROL REGISTER | | | | | | | |
| 10H | 90H | STATUS REGISTER | | | | | | | |
| 11H | 91H | TRICKLE CHARGER REGISTER | | | | | | | |
| 12H-1FH | 92H-9FH | RESERVED | | | | | | | |

FIG. 12

PROGRAMMABLE POWER SUPPLY SYSTEMS AND METHODS PROVIDING A WRITE PROTECTED MEMORY HAVING MULTIPLE INTERFACE CAPABILITY

CROSS-REFERENCE TO RELATED APPLICATIONS

This application hereby incorporates by reference:

| Serial No./ U.S. Pat. No. | Filing Date/ Issue Date | DSC Case No. | Authors |
| --- | --- | --- | --- |
| 07/628,693 5,148,051 | 12/14/90 09/15/92 | DSC-186 | Kevin Deierling and Louis Rodriguez |
| 07/628,691 | 12/14/90 | DSC-187 | Louis Rodriguez and Kevin Deierling |
| 08/264,389 | 06/23/94 | DSC-414 | Brian Jones and Alan Morton |

BACKGROUND

Primary and secondary power supplies are often used in tandem to power various forms of application circuitry (e.g., timekeeping). Inputs for primary power supplies have typically been electrically coupled to system power sources and inputs for secondary power supplies have been electrically coupled to back-up power supplies (e.g., batteries), neither of which were rechargeable (e.g., rechargeable batteries). The power management circuitry used to control power supplies have not allowed convenient mechanisms or methods that allow users to access and/or recharge batteries that are used as a power supply. As a result, a user's choice has been rather limited. The user could use only the system power supply (e.g., for the first power source) and non-rechargeable batteries for the primary and secondary power supplies. Alternatively, if the user insisted on rechargeable batteries, external charging circuitry was required, because necessary circuitry (if it existed at all) could not be easily integrated into an integrated circuit. As referenced above, a reliable power supply is an especially important consideration in time-keeping applications, because users generally want to perpetually save, back-up, and otherwise preserve timekeeping information (e.g., what time is it?). However, it is important in other applications as well.

The use of multiple power supplies in systems can introduce other complications to integrated circuits, especially CMOS integrated circuits. CMOS circuits powered by two different supply levels cannot be directly connected together because of the diodes that typically exist in CMOS circuits for processing reasons and for ESD protection. In addition, power consumption may increase when connecting circuits that are powered by power supplies having differing power supply levels.

More specifically, two situations generally apply: a circuit being supplied by a higher supply driving a circuit being powered by a lower supply and a circuit being supplied by a lower supply level driving a circuit being powered by a higher supply. In the first situation, the circuit powered by a voltage supply having the lower supply level generally has an input that transitions above the voltage level corresponding to the power supply powering it, because it is being driven by the circuit with the higher supply. Since a diode typically exists between the input of the lower supply level circuit and its supply voltage, any transition more than a diode drop above its supply will forward bias this diode and must not be allowed. Not only could this cause a latch-up problem within the circuit but the input pin would actually begin to supply the current for the operation of the lower supply level circuit.

The second situation addresses a power issue which has become very important over the last several years. Input signals from circuits that have lower supply levels than those of the circuits being driven may not transition high enough to stop the flow of current through input buffers of the higher supply level circuits. This will increase the power used by the higher supply circuit.

In addition, adding features to existing product lines introduces additional factors, such as compatibility issues. New generations of parts are preferably compatible with previous generations of parts. In addition, combing additional features, such as write protection, introduces additional requirements. This provides functionality to a broader application base with a single part. As a result, new features, such as those discussed above, need to be able to be added to or integrated with existing systems without altering the basic functionality or operation of previous generations of electrical devices (e.g., integrated circuits). For instance, when there are a limited number of pins, one cannot simply add an extra pin to invoke or activate the newly added feature. Thus, it complicates the addition of new features without affecting the basic functionality.

SUMMARY OF THE INVENTIONS

A programmable power controller controls power between a first power source (e.g., a primary power source or system power source, which is typically non-rechargeable) and a second power source (e.g., a secondary power source or a back-up power supply, such as a battery or capacitor that can be charged up). First and second power sources have a first voltage and second voltage respectively. The first and second power sources are preferably used to independently power first circuitry. Circuitry is used to compare the first voltage and the second voltage to determine which is greater and then to couple the greater of the first power source or the second power source to the first circuitry to power the first circuitry. Preferred embodiments also provide the additional feature of providing write protection for data in memory, which is coupled to the first logic circuitry and is read and written to via an input/output buffer. This write protection capability is typically activated when a non-rechargeable backup supply is being used. The second logic circuitry is coupled to the memory and to said first logic circuitry and activates write protection circuitry to prevent writing to the memory if the secondary power source is powering the first logic circuitry, the second logic circuitry, and/or the memory. Write protection not only keeps the data from being corrupted during a main power failure, but also lowers the power requirements of the circuit in order to conserve the backup supply. In particular, this additional write protect capability is performed by disabling the interface when the main supply voltage is less than the back-up supply voltage. And, as a result, the active power requirements are reduced by not allowing the user to access the memory.

While varying numbers of pins could be used, preferred embodiments use only three pins to provide this functionality. Preferred embodiments of the three pin programmable power supply generally have three operating configurations: backup supply is a non-rechargeable supply (with need to protect memory data); backup supply is either rechargeable or non-rechargeable (without need to protect data); and low power single supply.

In addition, a control register has a first field that is used to activate circuitry that directs power from first power source to the second power source. The control register also has a second field used to select an electrical path having a first voltage drop that ensures first power source will have a higher voltage than the second power source when first power source is active under normal operating conditions. Diodes are preferably used to provide the necessary voltage drops. The control register also has a third field used to select an electrical path from a plurality of electrical paths, each electrical path having an unique series resistance. The electrical path governed by the second field preferably incorporates at least one diode. The electrical paths governed by the third field have different resistances. The second power source may be chargeable. The circuitry used to implement the conductive paths constitutes a trickle charger. However, if the second power source is not rechargeable, the trickle charger can be bypassed, so that preferred embodiments are compatible with previous generations of products that lack a trickle charger and/or do not use a chargeable power source for the second power source. Preferred embodiments have three electrical paths governed by the third field with the following resistances: $2K\Omega$, $4K\Omega$, and $8K\Omega$. In addition, preferred system embodiments allow the user to activate the programmable power supply system and to select the type of first and/or second power supply which is connected to the circuit via a first and second pin. This circuit adds the additional capability for second power sources that are rechargeable, such as rechargeable batteries or large capacitors known as "super caps".

More specifically, preferred embodiments of the programmable power controller comprise first switching circuitry, second switching circuitry, third switching circuitry, control register, and a comparator. The first switching circuitry is electrically coupled to a primary power source and the second switching circuitry is electrically coupled to the second switching circuitry and to a first plurality of conductive paths, each of which has a voltage drop that is not equal to any other, and the third switching circuitry is electrically coupled to the first plurality of conductive paths and to a second plurality of conductive paths, each of which has a resistance that is not equal to any other. The second plurality of conductive paths are electrically coupled to a secondary power source. The control register has a first field, a second field, and a third field. The first field is electrically coupled to first switching circuitry and the second field is electrically coupled to the second switching circuitry and the third field is electrically coupled to the third switching circuitry. The comparator compares first voltage of the primary power source with the second voltage of the second power source to determine which is greater and then to couple the primary power source or the secondary power source depending upon which is greater to power first logic circuitry, second logic circuitry, and memory. The second logic circuitry determines whether the primary power source or the secondary power source is powering the first logic circuitry and if the secondary power source is powering the first logic circuitry, the second logic circuitry, and the memory, the second logic circuitry activates write protection circuitry to prevent the memory from being written to, the second logic circuitry coupled to the memory and to the second logic circuitry.

Preferred embodiments of the multiple voltage interface system comprise a first voltage interface able to be electrically coupled to first power supply having a first voltage level, a second voltage interface able to be electrically coupled to a second power supply having a second voltage level and switching circuitry to switch said second voltage interface on to receive and adjust said second voltage level to power an application system or to switch said first voltage interface on to receive and adjust said first voltage level to power said application system.

All preferred embodiments are preferably integrated onto a single silicon substrate.

The switching circuitry is preferably a level translator ("lvl_shift") coupled to a first power input. The switching circuitry switches the first power input to a first power output or a second power output depending upon said first power input. The first power output coupled to the application system via a first conductive path and the second power output coupled to the application system via a second conductive path. Moreover, preferred embodiments also comprise at least one transistor having a source, a gate, and a drain, wherein the first conductive path is electrically coupled to the source of the transistor(s) and the second conductive path is electrically coupled to the gate of the transistor(s), the drain of the transistor(s) coupled to said application system.

There are numerous advantages of the preferred embodiment discussed below. The system discussed above is compatible with and easily incorporates the functionality and purpose of the two pin programming mode that is discussed in the patent application (DSC-414) having U.S. Ser. No. 08/264,389, which is incorporated by reference hereinabove. In particular, regarding the advantages associated with that circuitry, the disclosed charging scheme is simple enough that it provides continuous charging of back-up supply while the primary power source remains connected and is at an adequate voltage. Similarly, the charging scheme allows user flexibility in setting both charging current and voltage. The diode drop(s) also ensure that the charged supply will always have a smaller voltage than the charging supply so that the comparator that determines which supply is connected to the circuit makes the proper decision when the charging supply has sufficient voltage. Preferred embodiments also allow users to connect either rechargeable batteries or large capacitors, which are known as "super caps", to supply power to the integrated circuit (e.g., the serial timekeeping chip). In addition, preferred embodiments also provide a protection against the charging of non-rechargeable power supplies by defaulting to the dual power supply mode which disables the trickle charger. No external circuits are required.

In addition to the above advantages, preferred embodiments provide user with all the features of the previous two pin power supply system plus a method of protecting the memory data and also conserving backup supply energy. Preferred embodiments also provides protection against non-rechargeable battery back-charging. Preferred embodiments provide for an easy selection of power supply configuration by simply grounding the unused power connection. Power supply pins are used as the mode select. Moreover, preferred embodiments only require three pins to operate.

The advantages recited above are important, because they can be extended to other parts and other applications. Preferred embodiments are easily adaptable to using power pins for enabling test mode conditions that the user is not allowed access (e.g., disabling a 32 kHz output, etc.). Preferred embodiments also provide a three pin power supply system that does not have to use the trickle charger, because it is connected to only one of the backup supply pins. Preferred embodiments provide a means for the user to select whether or not write protection during backup is enabled. In addition, preferred embodiments could also be configured to allow user to select which backup supply is connected to the trickle charger so that write protection is provided for the rechargeable supply.

Regarding the trickle charger, depending on the normal operating voltage, any number of diode drops could be available to the user by adding more register bits and the appropriate decode. Similarly, depending on the current requirements, any number of different value resistors could be made available to the user by adding more register bits and the appropriate decode. In addition, the level of security against accidental enabling of the charger could be improved by adding more bits in the control register that allows this operation. Since only one code would enable the charger, the probability would be reduced as the number of bits gets larger. Likewise, the control bits could be of EEPROM type that get initialized at power-up so as to configure the power supply function of the integrated circuit that the user desires. A capacitor could also be integrated onto the integrated circuit to be a redundant back-up supply so that the user could disconnect the rechargeable power supply from the integrated circuit pin and still have enough back-up power to save memory registers. This is useful in replacing worn-out rechargeable batteries.

Preferred embodiments of the multiple voltage interface capability also address problems associated with the two situations described above. In particular, the multiple voltage interface allows the interfacing of integrated circuits that are powered by different supply levels, which allows the driving circuit to have either a higher supply level or a lower supply level than the driven circuit. If the driver circuit's supply voltage is used to provide the interface supply voltage, the driver circuit will automatically disable itself when the driven circuit's supply voltage fails. If the driven circuit's supply voltage is used to provide the interface supply voltage, the output will disable to the interface voltage level if the driver circuit's main supply voltage fails. No unnecessary current is used because of improper biasing of the driven circuit's input stages. Preferred embodiments of the multiple interface system also provide full active drive CMOS output levels. Output swings "rail-to-rail" (e.g., extreme to extreme), which eliminates the need for open drain output driver circuits with resistive pull-ups. Preferred embodiments also provide a separate output power supply to reduce the current on the circuit's main power supply. This is particularly important in battery backed applications which require outputs to be driven off the back-up battery (i.e., 32 kHz square wave output, etc.). Finally, preferred embodiments also reduce switching noise on the main power supply.

BRIEF DESCRIPTION OF THE DRAWING

Further features and advantages will become apparent from the following and more particular description of the various embodiments of the invention, as illustrated in the accompanying drawings, wherein:

FIG. 11 is an address map of memory found in a preferred implementation of the circuitry described above in reference to the general architecture shown in FIG. 5A;

FIG. 12 is map of rtc registers found in a preferred implementation of the circuitry described above in reference to the general architecture shown in FIG. 5A;

DETAILED DESCRIPTION OF THE PREFERRED EMBODIMENTS

Figure 1:
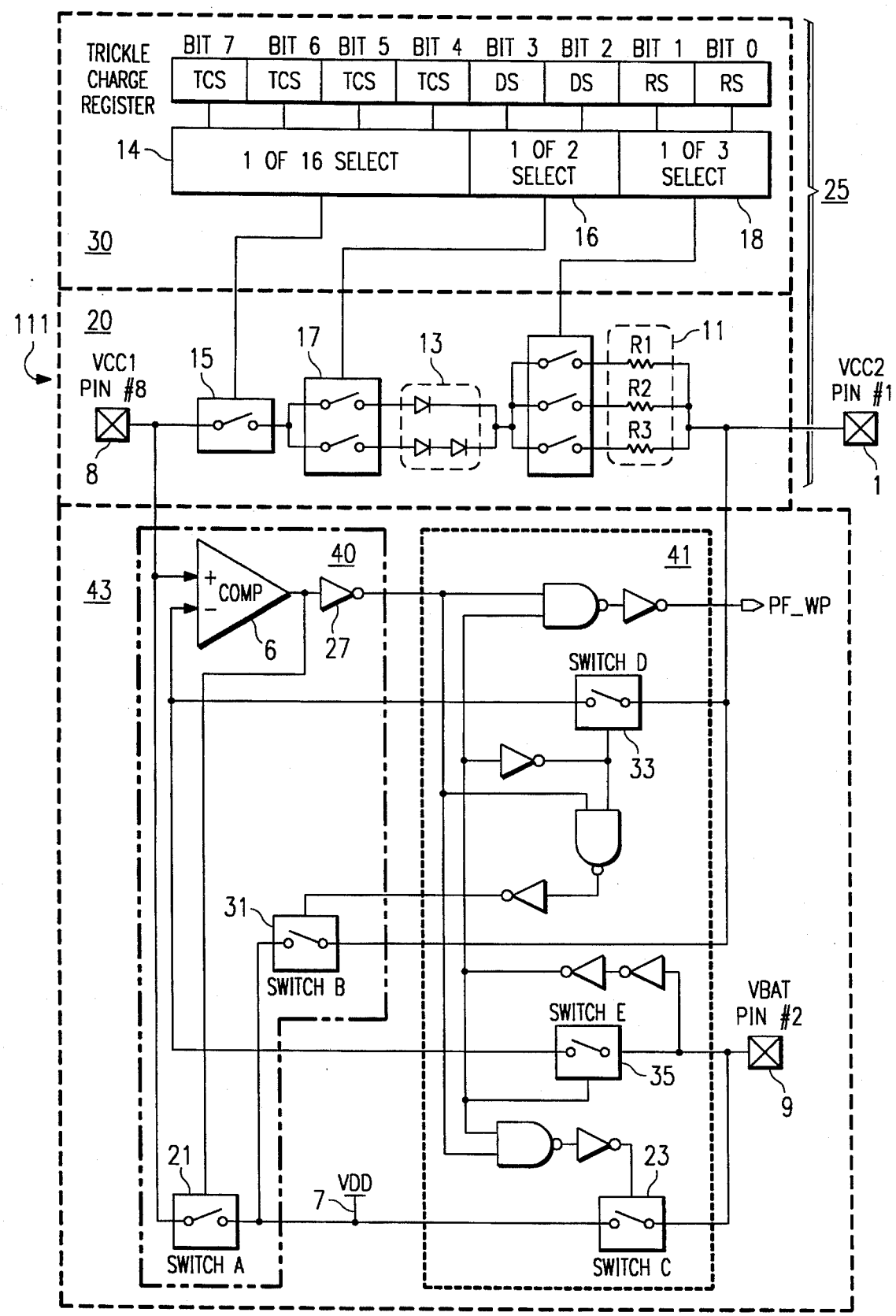
FIG. 1 is a block diagram of the combined programmable power supply system (e.g., trickle charger) and write protection system 110.

Referring to FIG. 1, the programmable power supply portion 111 of combined programmable power supply system and write protection system 110 shown in FIG. 1 is comprised of two general blocks: power control block 25 (e.g., that implements the trickle charger) and power switch block 40. Power control block 25 is preferably comprised of multiple power control block 20 (see FIG. 2A for a preferred embodiment) and power supply control register block 30 (e.g., trickle charge register) (see FIG. 2B for a preferred embodiment). The preferred implementation of power switch block 40 is shown in FIG. 3A.

Regarding the operation of combined programmable power supply and write protection system 110, the programmable power supply portion 111 of combined programmable power supply and write protection system 110 automatically initializes itself for operation as a dual power supply system. First pin 8, which is also labeled $V_{CC1}$ and pin #8 in FIG. 1, and second pin 1, which is also labeled $V_{CC2}$ and pin #1 in FIG. 1, are electrically coupled to the programmable power supply portion 111 and write protection system 110 shown in FIG. 1 as well as the rest of the integrated circuit (e.g., timekeeping circuitry—see FIGS. 5A and 5B). Note the numbers assigned to first pin 8 and second pin 1 correspond to the actual pin assignments of a preferred embodiment of an application of the disclosed invention (see FIGS. 4A and 4B). First pin 8 is preferably electrically coupled to first power supply (e.g., $V_{CC1}$). Second pin 1 is preferably electrically coupled to a second power supply (e.g., $V_{CC2}$), such as a rechargeable battery (e.g., rechargeable Lithium, NiCd, NMH). Multiple power control block 20 of programmable power supply portion 111 enables second power supply to be charged in a trickle charge fashion.

Circuit comparator 6 in conjunction with switch blocks 21 and 31 and inverter 27 determine whether first power supply (which is inputted via pin 8—the $V_{CC1}$ hook-up) or second power supply (which is inputted via pin 1—the $V_{CC2}$ hook-up) has the largest voltage and electrically couples the supply having the largest voltage to the application circuitry through the $V_{DD}$ node 7. In light of the fact the application circuitry may perform virtually any function, the circuitry is not immediately shown in great detail in FIG. 1. However, circuitry powered in a preferred application (e.g., timekeeping circuitry) is shown in subsequent figures and described below. In addition, note that the resulting impedance of the diode combination 13 (which exist independently from one another or are taken in combination) and the resistor array 11 (which exist independently from one another or are taken in combination) ensures that the voltage corresponding to second power supply (e.g., $V_{CC2}$) is lower than the voltage corresponding to first power supply, (e.g., $V_{CC1}$) so that the circuit comparator 6 will determine that first power source is higher and the surrounding circuitry (switch blocks 21 and 31 and inverter 27) will couple the first power supply to the application circuitry in normal operation. This will change when first power source drops below a preselected range (e.g., namely the voltage drop associated with the programmed impedance between first pin 8 and second pin 1). Power supply represented by $V_{CC1}$, which is electrically coupled to the programmable power supply portion 111 through first pin 8, supplies the necessary current to run circuit comparator 6 (and any additional comparators) that determines which of the two power supplies should be electrically coupled to the application circuitry (e.g., timekeeping) via node $V_{DD}$. Power supplies represented by $V_{CC1}$ and $V_{CC2}$ supply the necessary current to power circuitry during an access to the internal registers as well as to power circuitry that must remain active at all times (e.g., clock registers). As a result, the power supply chosen typically consumes more power than the other power supply. However, if $V_{CC1}$ is present, it will generally consume more than $V_{CC2}$ in preferred embodiments, because of the comparator current.

Programmable power supply portion 111, which is also called the dual supply system, is preferably programmed or initialized via power supply control register block 30 (e.g., trickle charge register). Power supply control register block 30 is preferably initialized by power-on reset circuitry 331, which is shown in FIG. 2E. Power supply control register block 30 (and, thus, multiple power control block 20) preferably naturally powers-up in a state that disables circuitry comprised in the multiple power control block 20 powered via node $V_{DD}$, so that the application circuitry (not shown) is compatible with existing embodiments of the application circuitry. In other words, the user must instruct, activate, or program multiple power control block 20 via power supply control register block 30. The inherent, preset, or default state does not automatically initiate this feature. This is important, because it allows the application circuitry (not shown) to be compatible with alternate embodiments of application circuitry that do not also utilize power control block 25.

Figure 2A:
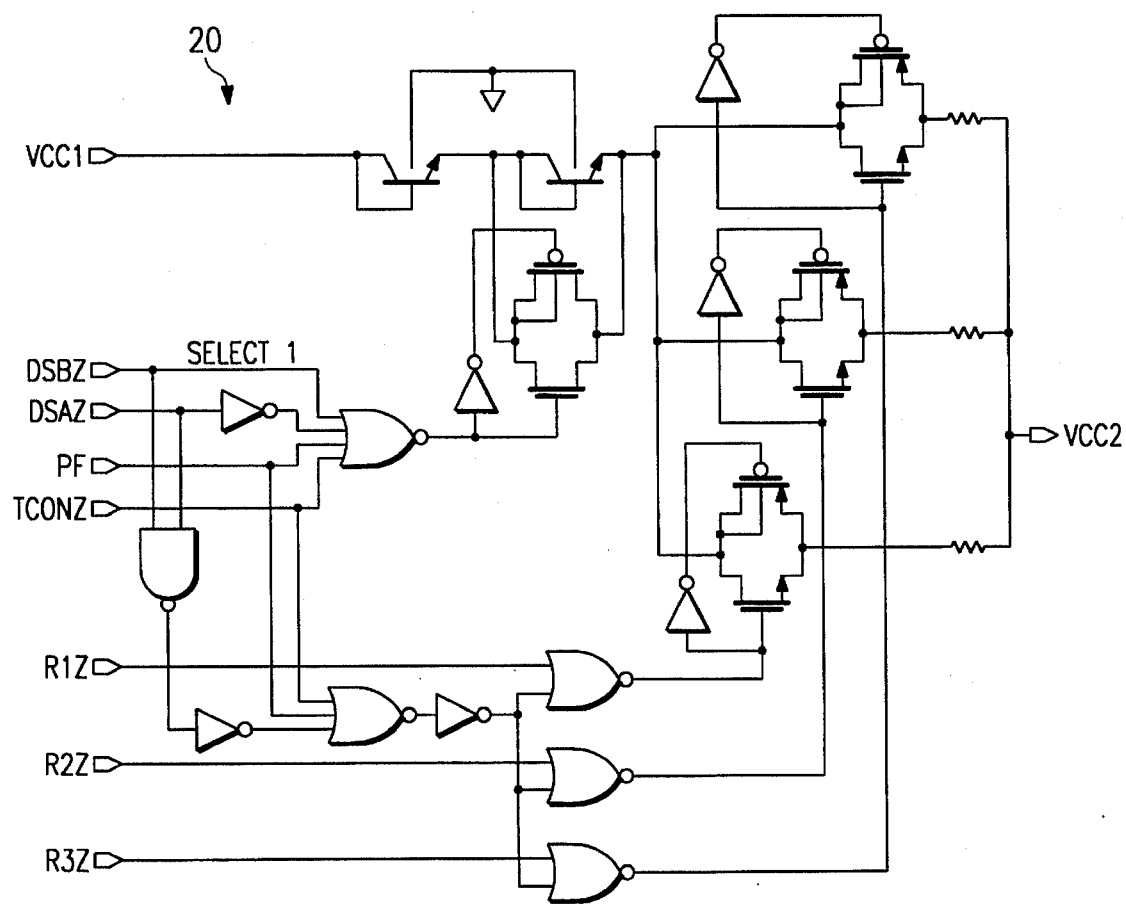
FIG. 2A is a schematic implementing multiple power control block 20 (e.g., trickle charger) of the overall block diagram of the combined programmable power supply (e.g., trickle charger) and write protection system 110 that is shown in FIG. 1.

In other words, as shown in FIG. 1 and FIG. 2A, power supply control register block 30, which is preferably 8 bits, sets the characteristics of the charging circuit and will be described later. If the user only wants to work in the default mode described above, he does not ever have to access power supply control register block 30 to configure programmable power supply portion 111. As a result, circuitry shown in FIG. 1 will then work to connect the supply with the largest voltage to the internal circuitry as have other circuitry found in products on which the circuitry described herein is preferably implemented, such as the DS1305, which is manufactured by Dallas Semiconductor Corporation and described in corresponding data sheet of their data book, which is incorporated by reference. As a result, the disclosed circuitry and added features are completely compatible with existing versions or forms of the application circuitry.

As discussed above, power supply control register block 30 sets the characteristics of multiple power control block 20. Multiple power control block 20 is comprised of circuitry used to trickle charge the rechargeable power supply, which functions as second power source (e.g., batteries or super capacitors) coupled to the circuitry shown in FIG. 1 via $V_{CC1}$ pin. As mentioned above, power supply control register block 30 has built-in features to assure that charger circuitry are not activated unless the user sets the proper bits, which ensures the default compatibility condition described above. In particular, there are a plurality of fields (e.g., three) of bits that make up the 8-bit power supply control register block 30. First field 14 consists of 4-bits that are used to enable charger. A preselected number of codes (e.g., one) or combination of bits will enable the charger; all other remaining codes are preferably invalid and disable charger circuitry. Second and third fields 16 and 18 set the electrical characteristics of charger circuitry. Only a valid code in all first, second and third fields 14, 16, and 18 will enable charger circuitry. Also, all of the bits of power supply control register block 30 are preferenced or biased to select a code which will disable charger circuitry upon the initial application of power to overall circuitry (including the circuitry shown in FIG. 1).

More specifically, power supply control register block 30 controls the charge characteristics of the overall charge circuitry. Charger select (TCS) bits 14 (bits 4–7) control the selection or activation of charger circuitry via switch block 15. In order to prevent accidental enabling, only a pattern of 1010 will enable charger circuitry. As discussed above, all other patterns will disable the charger. Diode select (DS) bits 16 (bits 2–3) select whether the path having one diode or the path having two diodes in the diode combination 13 are electrically coupled between first and second power sources electrically coupled to the circuitry via $V_{CC1}$ and $V_{CC2}$ pins via switch block 15. If DS is 01, the path having one diode is selected. Alternatively, if DS is 10, the path having two diodes are selected. If DS is 00 or 11, the charger is disabled independent of the status of TCS. Resistor select (RS) bits 18 (bits 0–1) select the specific resistor (e.g., 2KΩ, 4KΩ, or 8KΩ) to be electrically coupled between first and second power sources. If RS is 00, no resistor is selected and the charger is disabled independent of the status of TCS. If RS is 01, the 2KΩ resistor is selected to be electrically coupled between first pin 8 and second pin 1. If RS is 10, the 4 kΩ resistor is selected to be electrically coupled between first pin 8 and second pin 1. If RS is 11, the 8KΩ resistor is selected to be electrically coupled between first pin 8 and second pin 1.

Note that the number of diodes may differ, so long as alternate paths exist that have differing numbers of diodes. Similarly, the number of resistors and/or actual values of each resistor may vary depending upon the trickle charge requirements (e.g., voltage, current, etc.) of second power source (e.g., the rechargeable battery or super capacitor). This is important in light of the differing chemistries of rechargeable batteries. As discussed, preferred embodiments are flexible enough to take this into account. In particular, in preferred embodiments, diode and resistor selection is determined by the user according to the maximum current desired for the battery or super cap charging. The maximum current can be calculated as illustrated in the following example. Assuming that a system power supply of 5V is electrically coupled to first pin 8 and a super cap is connected to second pin 1 and assuming that the charger has been enabled with 1 diode and the 2KΩ resistor electrically coupled between the two pins, the maximum current $I_{MAX}$ would therefore be calculated as follows:

$$I_{MAX} = (5.0 \text{ V} - \text{diode drop})/R$$
$$\sim (5.0 \text{ V} - 0.7 \text{ V})/2 \text{ k}\Omega$$
$$\sim 2.2 \text{ mA}$$

Obviously, as the battery or super cap charges, the voltage drops between the first and second pins 8 and 1 will decrease and therefore the charge current will decrease.

Regarding charger operation, the overall circuitry, which is preferably implemented on an integrated circuit, can be configured to have a dual power supply system that will accept first power connection and a second power supply connection via first and second pins 8 and 1. This configuration allows the user to connect rechargeable batteries as well as large capacitors (e. g., 100 micro-Farads to one Farad) known as "super" caps to provide the power for the application circuitry. This operation is controlled by power supply control register block 30 in the manner described above.

Figure 2C:
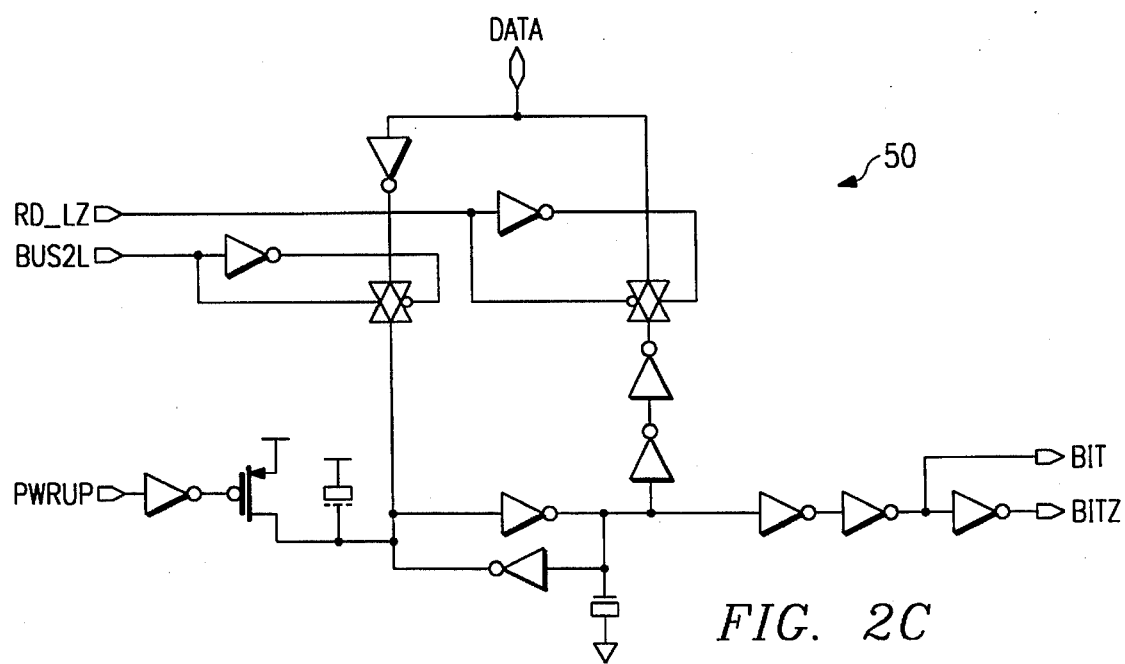
FIGS. 2C and 2D are schematics implementing latchpref0 blocks 50 and latchpref1 blocks 60 respectively of the schematic of power supply control register block 30 shown in FIG. 2B.
Figure 2B:
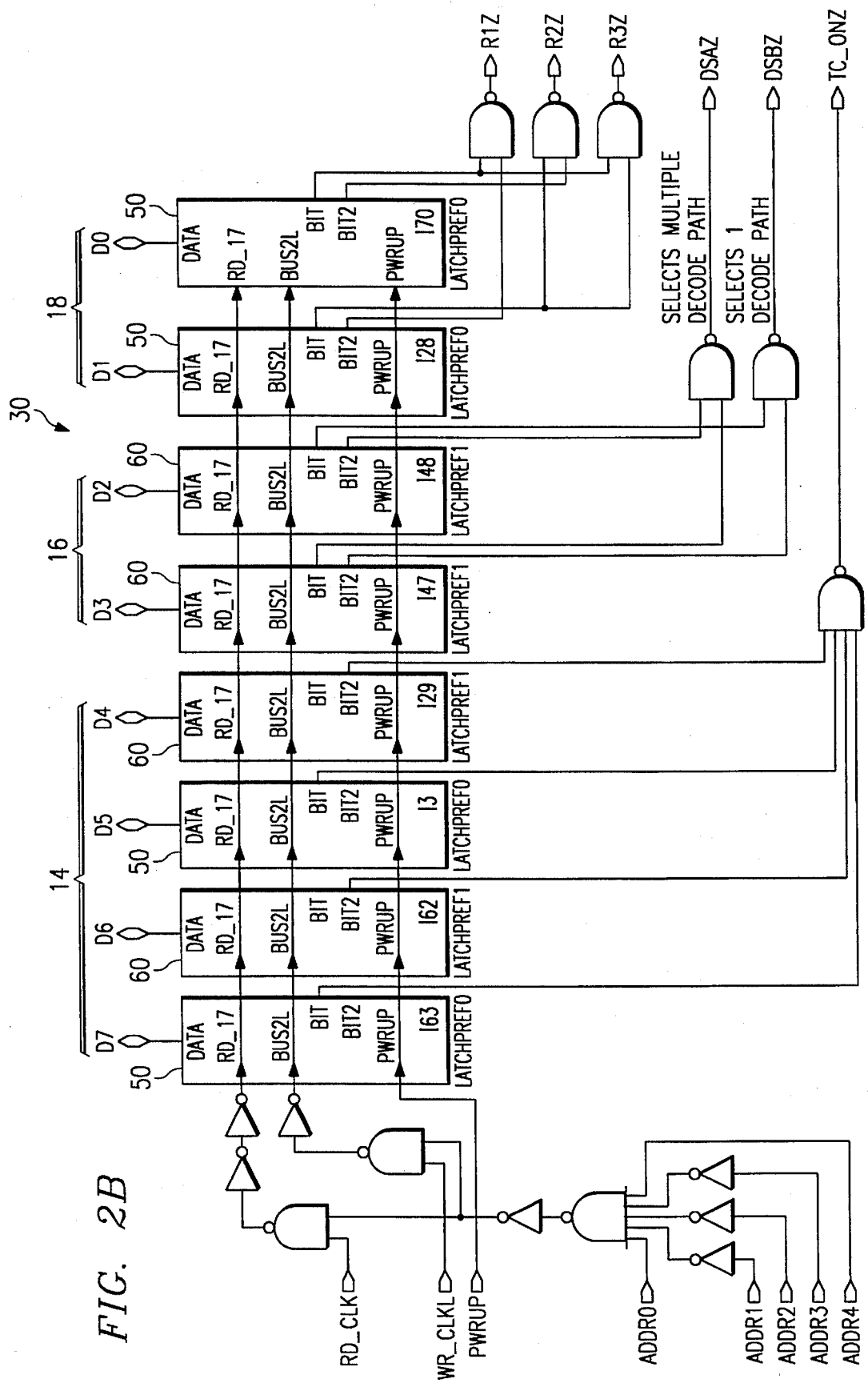
FIG. 2B is a schematic implementing power supply control register block 30 (e.g., trickle charge register) of the overall block diagram of the combined programmable power supply and write protection system 110 that is shown in FIG. 1.
Figure 2D:
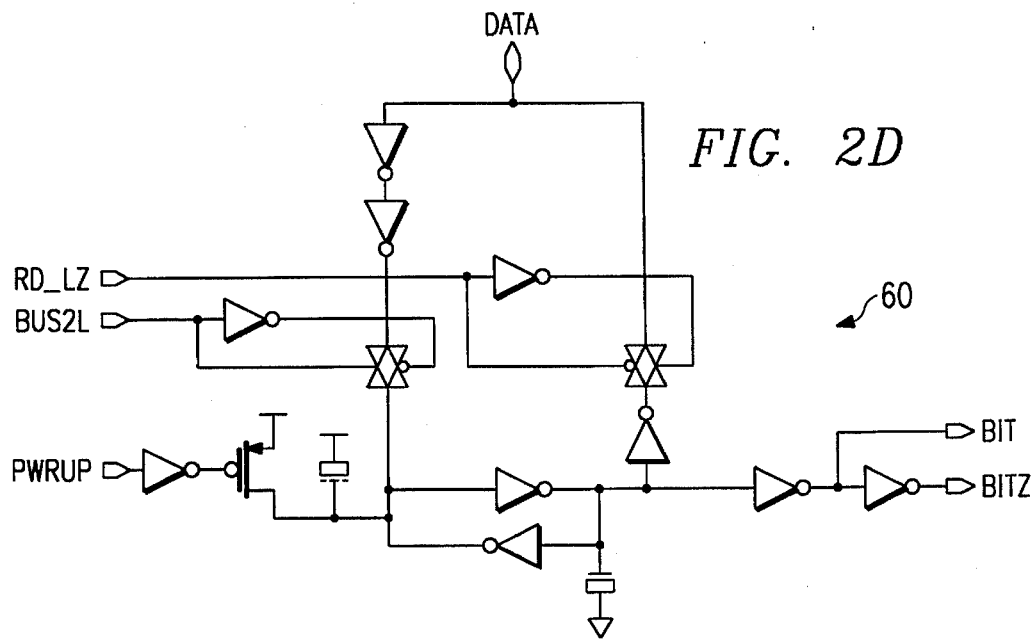
Figure 2E:
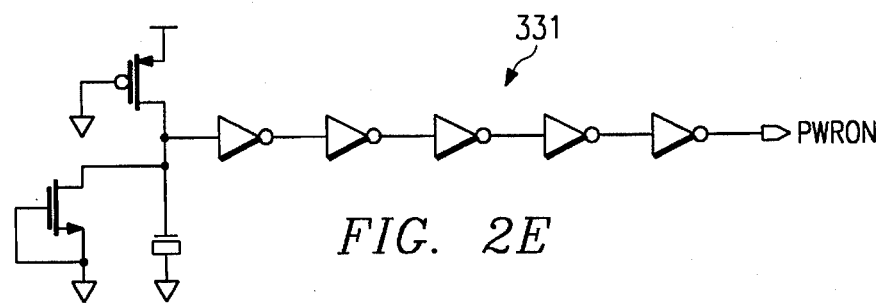
FIG. 2E is a schematic of power-on reset circuitry 331, which initializes power supply control register block 30 in FIG. 1.

FIG. 2A is a schematic implementing multiple power control block 20 (e.g., trickle charger) of the overall block diagram of the programmable power supply portion 111 that is shown in FIG. 1. FIG. 2B is a schematic implementing power supply control register block 30 (e.g., trickle charge register) of the overall block diagram of the programmable power supply and write protection system 110 that is shown in FIG. 1. FIGS. 2C and 2D are schematics implementing latchpref0 blocks 50 and latchpref1 blocks 60 respectively of the schematic of power supply control register block 30 shown in FIG. 2B and are self-explanatory. Latchpref0 blocks 50 and latchpref1 blocks 60 latch or hold the data bit information described above and, thus, collectively form power supply control register block 30.

Please note that preferred embodiments only use two diodes for diode combination 13, as opposed to three diodes, as shown in FIG. 1. Circuitry in addition to switching circuitry 17 is used to insure that the respective conductive paths having one diode or two diodes are coupled together accordingly. In other words, preferred embodiments use only two diodes, instead of three, and couple them together in series to implement the conductive path having two diodes and decouple them to implement the conductive path having only one diode. This feature saves dedicated circuitry and the corresponding area in the final system, which is preferably implemented on an integrated circuit.

Figure 3B:
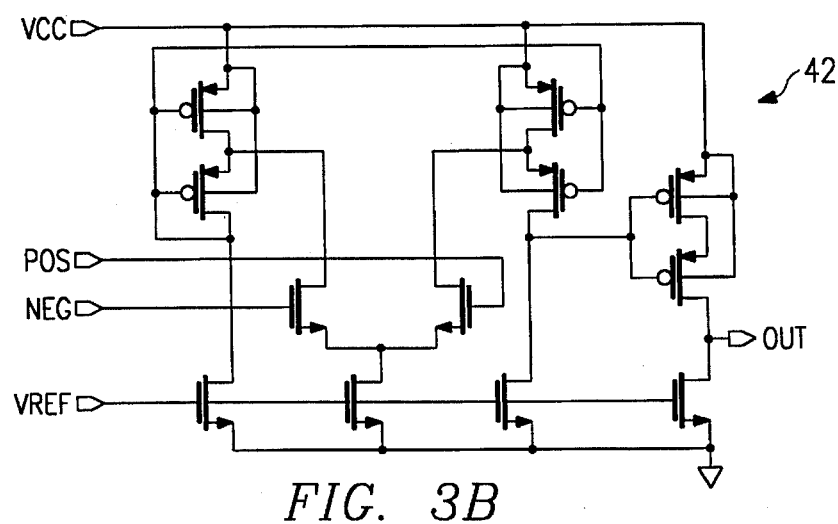
FIGS. 3B is a schematic implementing comparator 42 of power switch and write protect block 43 shown in FIG. 3A.
Figure 3A:
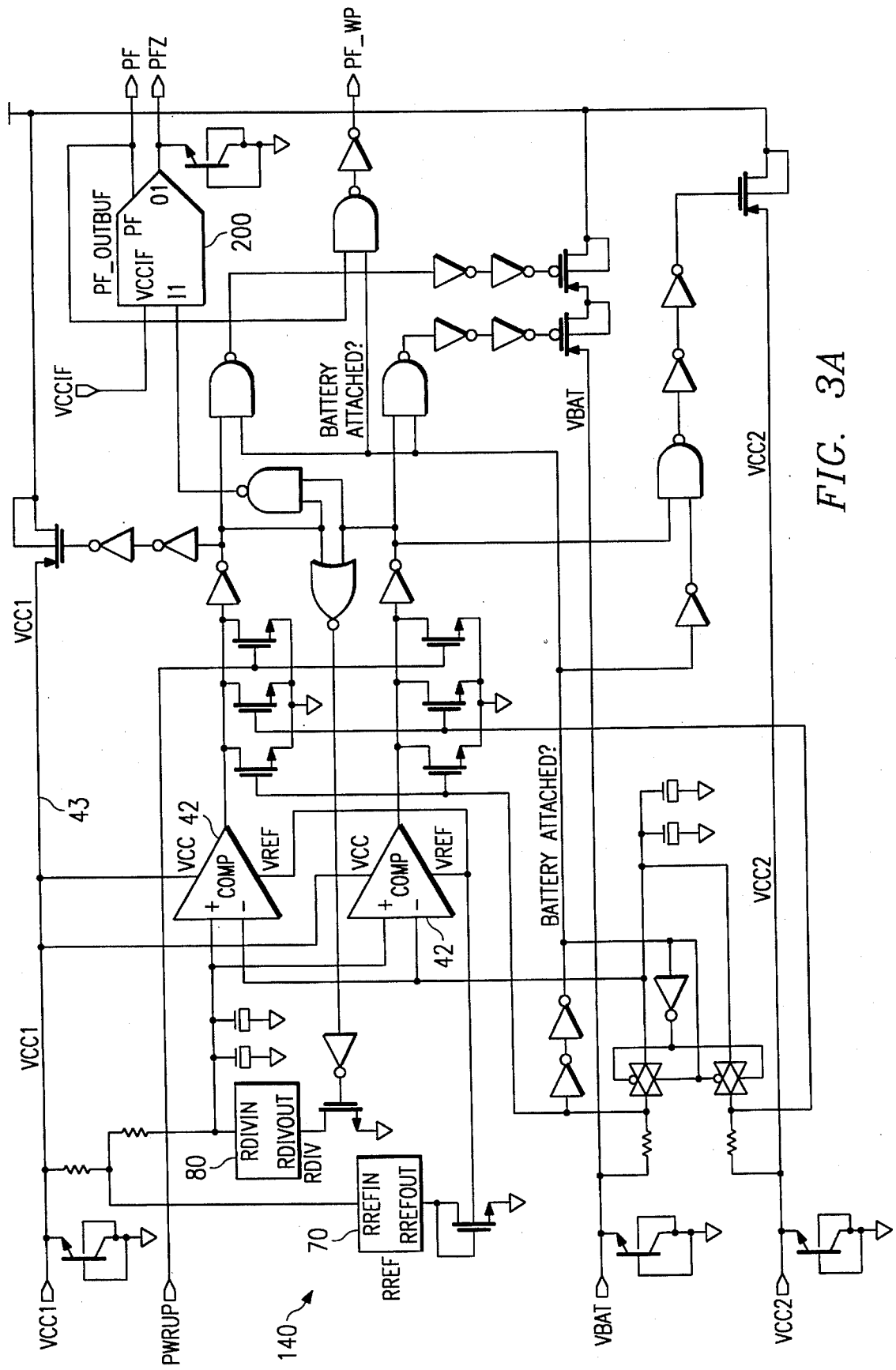
FIG. 3A is a schematic implementing power switch and write protect block 43 of the overall block diagram of the combined programmable power supply and write protection system 110 that is shown in FIG.1 and a block diagram of newpf or powerfail module 140 (in FIG. 5A), which switches the internal voltage supply between the primary and back-up supply voltage levels.
Figure 3C:
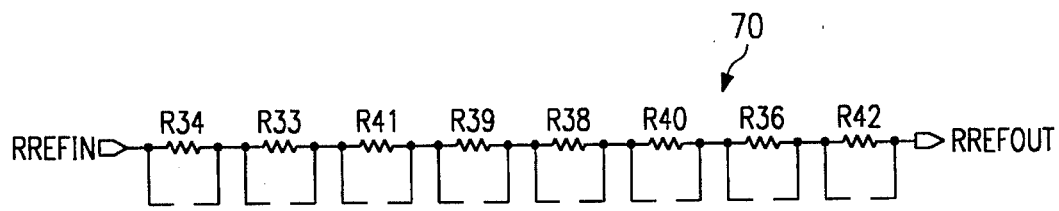
FIGS. 3C is a schematic implementing RRef block 70 of power switch and write protect block 43 shown in FIG. 3A.
Figure 3D:

Similarly, FIG. 3A is a schematic implementing power switch and write protect block 43 of the overall block diagram of the programmable power supply portion 111 that is shown in FIG. 1. FIG. 3B is a schematic implementing comparator 42 of power switch and write protect block 43 shown in FIG. 3A. FIG. 3C is a schematic implementing RRef block 70 of power switch and write protect block 43 shown in FIG. 3A. FIG. 3D is a schematic implementing RDiv block 80 of power switch and write protect block 43 shown in FIG. 3A.

Figure 6A:
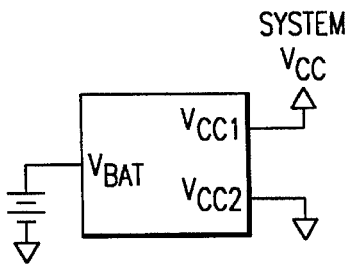
FIGS. 6A, 6B, and 6C show different configurations of preferred architecture shown in FIGS. 5A and 5B and packaged in packages shown in FIGS. 4A and 4B, which are backup supply and is a non-rechargeable supply (with need to protect memory data); backup supply is either rechargeable or non-rechargeable (without need to protect data); and low power single supply.
Figure 6B:
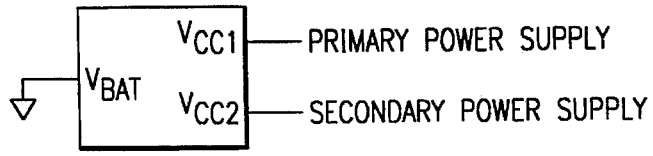
Figure 6C:
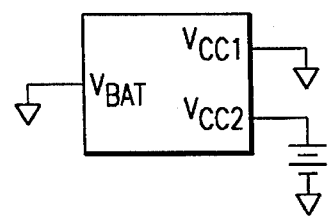
Figure 7:
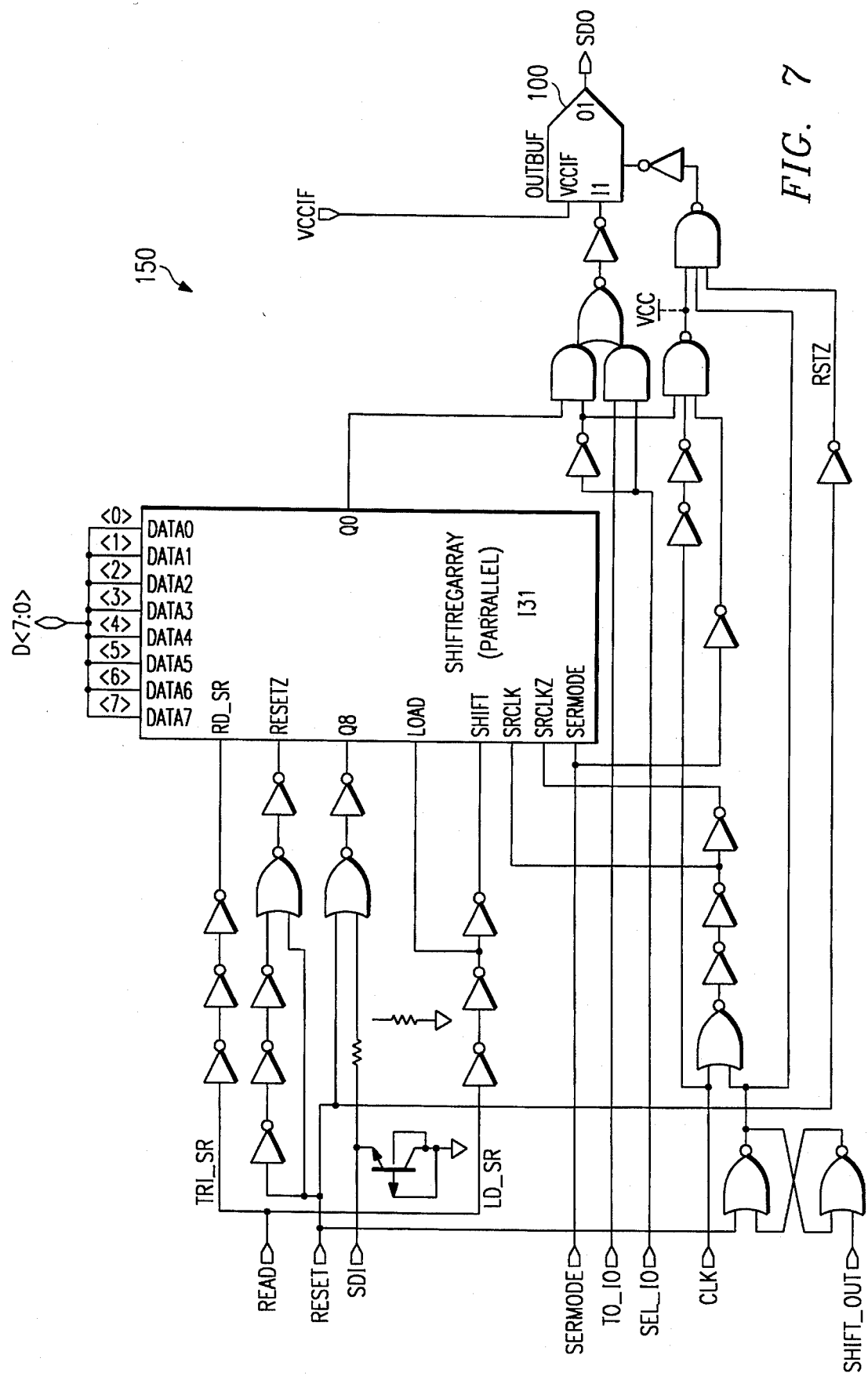
FIG. 7 is a block diagram of shiftblock module 150 (in FIG. 5A), which shifts in serial I/O data for internal circuit use.

Regarding the write protection portion 41 of combined programmable power supply and write protection system 110, three overall configurations are provided: backup supply is a non-rechargeable supply (with need to protect memory data); backup supply is either rechargeable or non-rechargeable (without need to protect data); and low power single supply. These three configurations are shown in FIGS. 6A, 6B, and 6C.

Regarding the configuration providing the backup supply that is a non-rechargeable supply (with need to protect memory data), the rechargeable power supply connection, which is unused $V_{CC2}$, is preferably grounded. In light of the above discussion regarding the programmable power supply portion 111, which preferably operates as a 2 pin programmable power supply, the charging path between first pin 8 (which is also labeled $V_{CC1}$ and pin #8 in FIG. 1) and second pin 1 (which is also labelled $V_{CC2}$ and pin #1 in FIG. 1) is disabled to minimize the use of unnecessary current. When a voltage is applied to third pin 9, which is also labeled as VBAT and pin #2 in FIG. 1, second switch 31 (switch B in FIG. 1) and fourth switch 33 (switch D in FIG. 1) will be disabled and fifth switch 35 (switch E in FIG. 1) will be enabled. Once again, third pin 9 is electrically coupled to the programmable power supply portion 111 shown in FIG. 1 as well as the rest of the integrated circuit. Circuit comparator 6 will determine whether first switch 21 (switch A) or third switch 23 (switch C) will be enabled thereby powering the internal power VDD (node 7). Also, a signal PF_WP is generated whenever the $V_{cc1}$ voltage is below the VBAT voltage which disables the interface to the circuit so that the memory data is write protected and the circuit is put into its low power mode.

Regarding the backup supply that is either rechargeable or non-rechargeable (without need to protect data), third pin 9, which is the unused power supply connection labeled VBAT on pin #2 in FIG. 1, must be grounded. This mode's functions enable the normal operation of the programmable power supply portion 111 described above, which preferably utilizes only two pins. When the ground voltage is applied to third pin 9 (VBAT on pin #2), third switch 23 (switch C) and fifth switch 35 (switch E) will be disabled and fourth switch 33 (switch D) will be enabled. Comparator 6 will determine whether first switch 21 (switch A) or second switch 31 (switch B) will be enabled thereby powering the internal power VDD (node 7). Since the VBAT voltage is ground, the PF_WP signal will always be in a low state which will not write protect the part when the $V_{CC1}$ voltage provided via first pin 8 falls below the $V_{CC2}$ voltage provided via second pin 1.

Regarding the low power single supply, the unused power supply connections labeled $V_{CC1}$ on pin #8 and VBAT on pin #2 must be grounded. This mode allows the user to operate the circuit to its lowest operating voltage and at its lowest operating current. When the ground voltage is applied to VBAT on third pin 9 (pin #2), third switch 23 (switch C) and fifth switch 35 (switch E) will be disabled and fourth switch 33 (switch D) will be enabled. Since the ground voltage is also applied to first pin 8 ($V_{CC1}$ on pin #8), comparator 6 will always enable second switch 31 (switch B) thereby permanently powering the internal power VDD with the corresponding voltage on second pin 1, which is $V_{CC2}$.

Figure 5A:
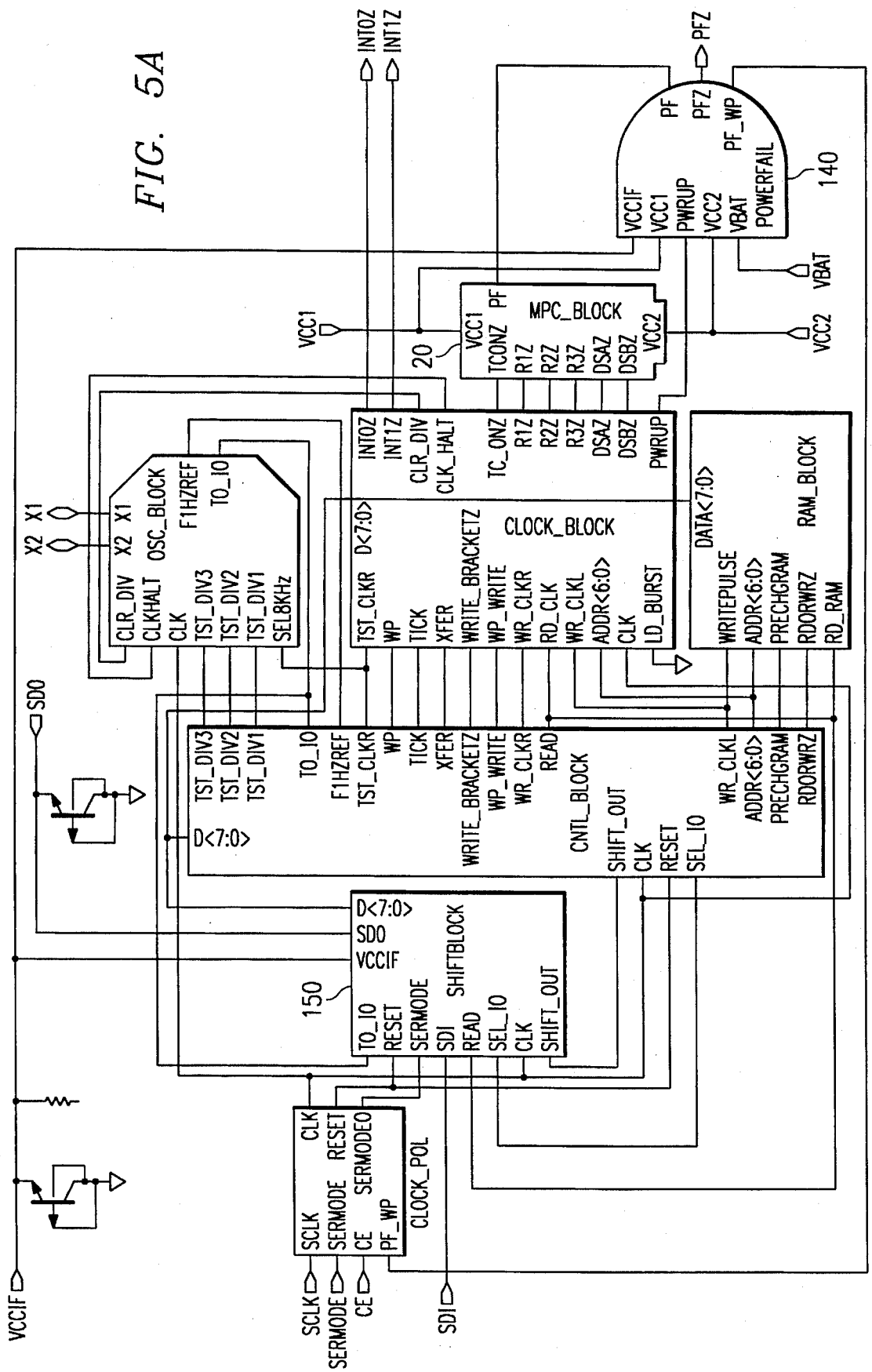
FIG. 5A is a block diagram of the preferred system application referenced in FIGS. 4A and 4B.

Referring again to the preferred architecture shown in FIG. 5A, the newpf or power fail module 140 and shiftblock module 150 implement the added feature and capability of providing a multiple voltage interface system for integrated circuits, which allows users to connect together circuits that are powered by different voltage supply levels. This feature is significant in that the voltage supply levels of backup power supplies, such as batteries, may vary from one another, and from the voltage level of a main power supply.

Figure 8:
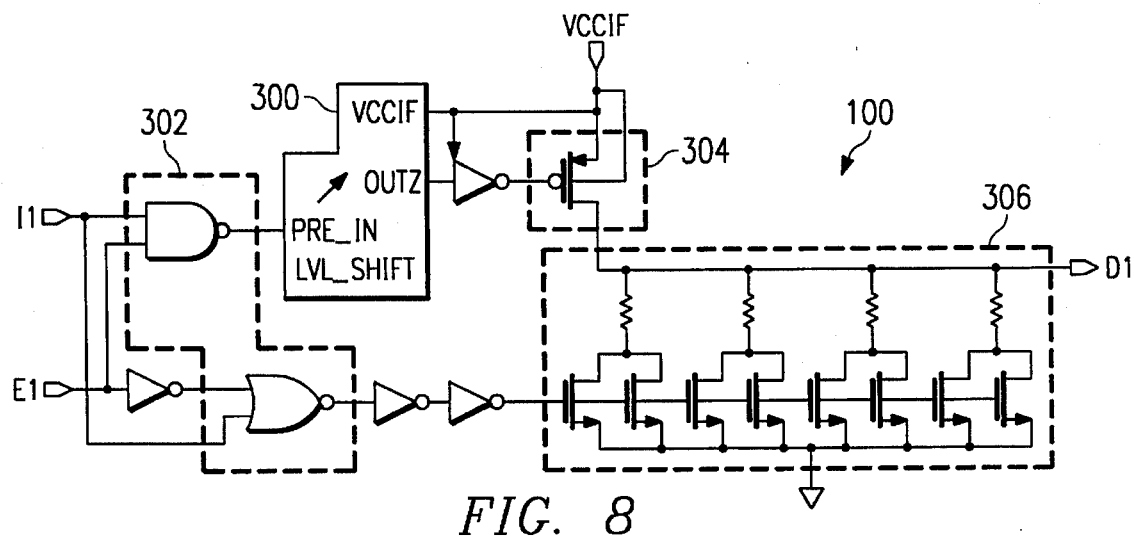
FIG. 8 is a block diagram of outbuf module 100 (in FIG. 7), which drives the external serial data pin.
Figure 9:
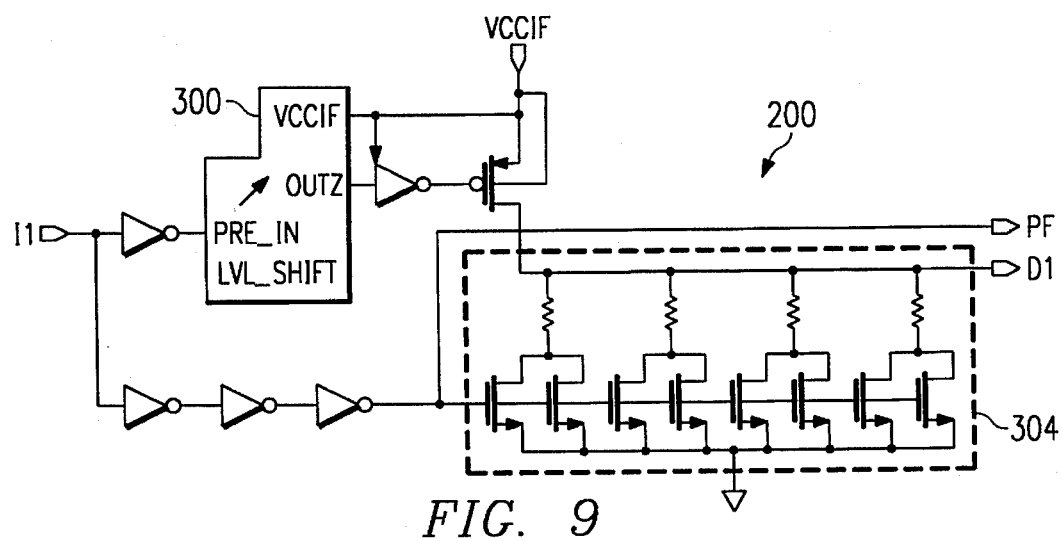
FIG. 9 is a block diagram of pf-outbuf module 200 (in FIG. 3A), which drives the external pf pin.
Figure 10:
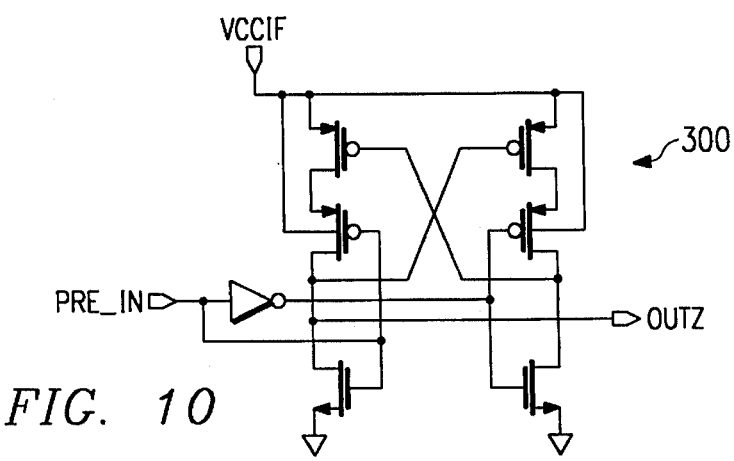
FIG. 10 is a block diagram of lvl_shift module 300 (in FIGS. 8 & 9), which translates between two different voltage supply levels.

Circuitry providing the multiple voltage interface system, such as that shown for outbuf module 100 in FIG. 8 and pf_outbuf module 200 in FIG. 9, provides for a specific interface supply voltage connection that powers only the appropriate interface circuits to address situations described above that require varying voltage interfaces. Outbuf module 100 in FIG. 8, which is comprised of lvl_shift module 300 (shown in FIG. 10) and logic circuitry 302, provides for a tri-state functional capability for a pin. Similarly, pf_outbuf module 200 (shown in FIG. 9), which is comprised of lvl_shift module 300 without the additional logic circuitry 302, only provides a bi-state functional capability for a pin. In other words, lvl_shift module 300 provides for a bi-state capability in and of itself. In order to provide for an interface driving a voltage different than the main power supply voltage in preferred embodiments, a transistor used to drive to a high voltage is connected to this interface supply, so that any external supply voltage can be coupled to pin $V_{CCIF}$ (and therefore used). Note a plurality of transistors 304 in parallel with one another (e.g., 8, which is denoted by M1–8) are actually used in preferred embodiments to handle the voltage and current requirements of the preferred external supply voltages, etc. The plurality of transistors 304 has been combined symbolically to a single transistor for the following discussion. Lvl_shift module 300 is used to internally drive the plurality of transistors 304, so that its controlling gate can be switched to this external interface level, so as to avoid any problem with turning this device off when the external interface supply via pin $V_{CCIF}$ is at a higher level than the circuit supply level.

This interface allows the driving circuit to provide the appropriate driving level for any externally driven circuit so as to avoid the above described situations.

Preferred embodiments described above and shown in FIGS. 8 and 9 of the multiple voltage interface capability also address problems associated with the two situations described above. In particular, the multiple voltage interface allows the interfacing of integrated circuits that are powered by different supply levels. It also allows the driving circuit to have either a higher supply level or a lower supply level than the driven circuit. If the driven circuit's supply voltage is used to provide the interface supply voltage, the driver circuit will automatically disable itself when the driven circuit's supply voltage fails. If the driven circuit's supply voltage is used to provide the interface supply voltage, the output will disable to the interface voltage level if the driver circuit's main supply voltage fails. No unnecessary current is used because of improper biasing of the driven circuits input stages. Preferred embodiments of the multiple voltage interface also provides full active drive CMOS output levels. Output swings "rail-to-rail" (e.g., extreme to extreme), which eliminates the need for open drain output driver circuits with resistive pull-ups. Preferred embodiments also provide a separate output power supply to reduce the current on the circuit's main power supply. This is particularly important in battery backed applications which require outputs to be driven off the back-up battery (i.e., 32 kHz square wave output, etc.). Finally, preferred embodiments also reduce switching noise on the main power supply.

Note outbuf module 100 is preferably implemented in general architecture shown in FIG. 5A in shiftblock module 150, which generally comprises circuitry that shifts in serial I/O data for internal circuit use. Similarly, newpf or power fail module 140 is preferably implemented in general architecture shown in FIG. 5A, which generally comprises circuitry that switches the internal voltage supply between the primary and backup supply voltage levels.

As mentioned above, preferred embodiments of the circuitry described above are generally implemented in timekeeping integrated circuits, such as a serial alarm real time clock or those described in the patents and/or patent applications incorporated above or serial timekeeping circuits manufactured by Dallas Semiconductor Corporation, the assignee in this case.

Preferred serial timekeeping circuits preferably have the following general features: real time clock counts seconds, minutes, hours, date of the month, month, day of the week, and year with leap year compensation; 96 byte nonvolatile RAM for data storage; Two Time of Day Alarms—programmable on combination of seconds, minutes, hours, and day of the week; Serial Interface supports Motorola™ Serial Peripheral Interface (SPI) serial data ports or standard 3-wire interface; Burst Mode for reading/writing successive addresses in clock/RAM; Dual power supply pins for primary and backup power supplies; optional trickle charge output to backup supply; 2.5–5.5 volt operation; optional 2.0–5.5 volt full operation also available; optional industrial temperature range −40° C. to +85° C.; Available in space-efficient 20-pin TSSOP package.

Figure 4A:
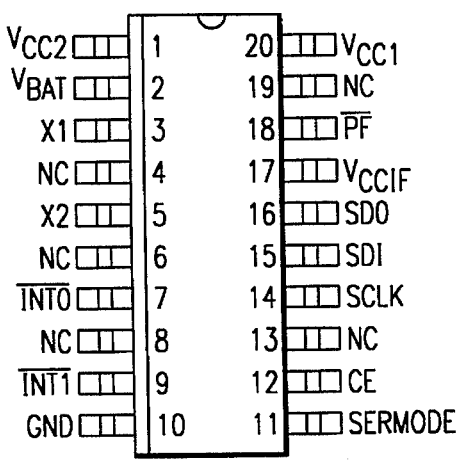
FIGS. 4A and 4B are examples of preferred embodiments of the preferred system application of the above circuitry showing the preferred pin assignments.
Figure 4B:
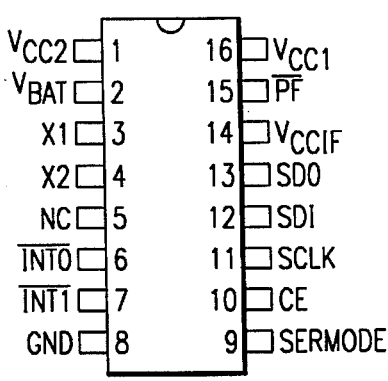

Preferred embodiments of the preferred system application of the above circuitry have the pin shown in FIGS. 4A and 4B and the following pin descriptions:

| PIN DESCRIPTION | |
|---|---|
| $V_{CC1}$ - | Primary Power Supply |
| $V_{CC2}$ - | Backup Power Supply |
| $V_{BAT}$ - | +3 Volt Battery Input |
| $V_{CCIF}$ - | Interface Logic Power Supply Input |
| GND - | Ground |
| X1, X2 - | 32,768 Hz Crystal Connection |
| $\overline{INT0}$ - | Interrupt 0 Output |
| $\overline{INT1}$ - | Interrupt 1 Output |
| SDI - | Serial Data In |
| SDO - | Serial Data Out |
| CE - | Chip Enable |
| SCLK - | Serial Clock |
| SERMODE - | Serial Interface Mode |
| $\overline{PF}$ - | Power Fall Output |

DESCRIPTION

Preferred system applications of the Serial Alarm Real Time Clock provides a full BCD clock calendar, which is accessed via a simple serial interface. The clock/calendar provides seconds, minutes, hours, day, date, month, and year information. The end of the month date is automatically adjusted for months with less than 31 days, including corrections for leap year. The clock operates in either the 24-hour or 12-hour format with AM/PM indicator. In addition 96 bytes of nonvolatile RAM are provided for data storage.

An Interface logic power supply input pin ($V_{CCIF}$) allows the preferred system applications to drive SDO to $\overline{PF}$ pins to a level that is compatible with the interface logic. This allows an easy interface to 3 volt logic in mixed supply systems.

As described above, preferred system applications offer dual power supplies as well as a battery input pin. The dual power supplies support a programmable trickle charge circuit which allows a rechargeable energy source (such as a super cap or rechargeable battery) to be used for a backup supply. The $V_{BAT}$ pin allows the device to be backed up by a non-rechargeable battery. Preferred system applications is fully operational from 2.5 to 5.5. volts.

Two programmable time of day alarms are provided by the preferred system application. Each alarm can generate an interrupt on a programmable combination of seconds, minutes, hours, and day. "Don't care" states can be inserted into one or more fields if it is desired for them to be ignored for the alarm condition. The time of day alarms can be programmed to assert two different interrupt outputs or to assert one common interrupt output. Each interrupt outputs operate when the device is powered by $V_{CC1}$, $V_{CC2}$, or $V_{BAT}$.

Preferred system application supports a direct interface to Motorola™ SPI serial data ports or standard 3-wire interface. An easy-to-use address and data format is implemented in which data transfers can occur one byte at a time or in multiple byte burst mode.

OPERATION

Figure 5B:
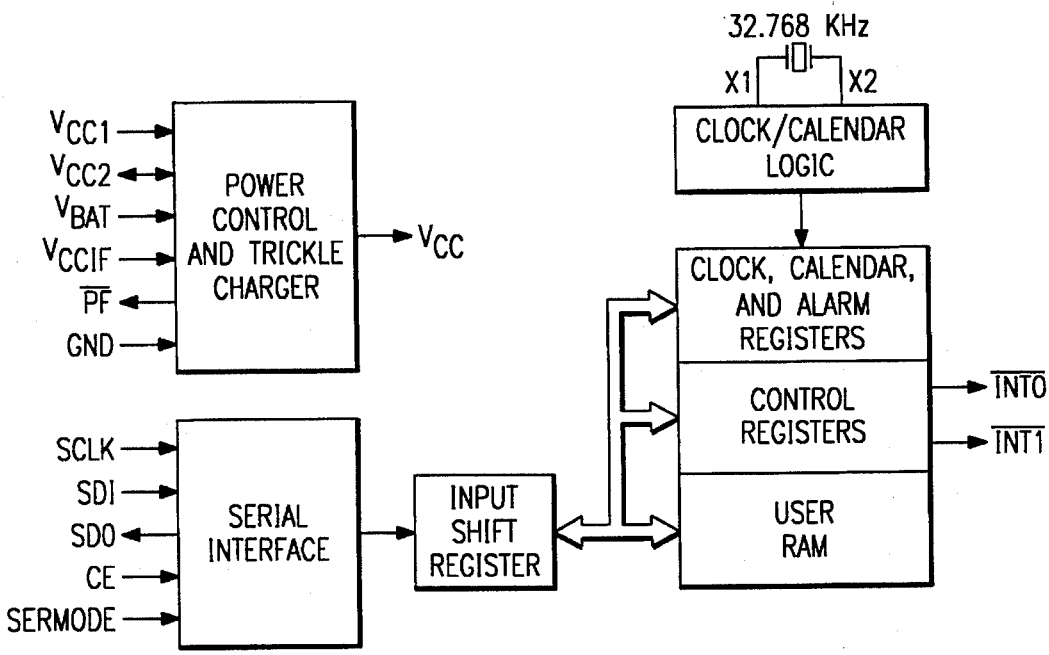
FIG. 5B is a conceptual block diagram of the preferred system application referenced in FIGS. 4A and 4B.

The block diagram shown in FIG. 5B shows the main elements of the Serial Alarm RTC. The following paragraphs describe the function of each pin.

Signal Descriptions $V_{CC1}$—DC power is provided to the device on this pin. $V_{CC1}$ is the primary power supply.

$V_{CC2}$—This is the secondary power supply pin. In systems using the trickle charger, the rechargeable energy source is connected to this pin.

$V_{BAT}$—Battery input for any standard 3 volt lithium cell or other energy source.

$V_{CCIF}$(Interface Logic Power Supply Input)—The $V_{CCIF}$ pin allows the preferred system application to drive SDO and $\overline{PF}$ output pins to a level that is compatible with the interface logic, thus allowing an easy interface to 3 volt logic in mixed supply systems. This pin is physically connected to the source connection of the p-channel transistors in the output buffers of the SDO and $\overline{PF}$ pins.

SERMODE (Serial Interface Mode Input)—The SERMODE pin offers the flexibility to choose between two serial interface modes. When connected to GND, standard 3-wire communication is selected. When connected to $V_{CC1}$ Motorola™ SPI communication is selected.

SCLK (Serial Clock Input)—SCLK is used to synchronize data movement on the serial interface for either the SPI or 3-wire interface.

SDI (Serial Data Input)—When SPI communication is selected, the SDI pin is the serial data input for the SPI bus. When 3-wire communication is selected, this pin must be tied to the SDO pin (the SDI and SDO pins function as a single I/O pin when tied together).

SDO (Serial Data Output)—When SPI communication is selected, the SDO pin is the serial data output for the SPI bus. When 3-wire communication is selected, this pin must be tied to the SPI pin (the SDI and SDO pins function as a single I/O pin when tied together).

CE (Chip Enable)—The Chip Enable signal must be asserted high during a read or a write for both 3-wire and SPI communication. This pin has an internal 55K pull-down resistor (typical).

$\overline{INT0}$ (Interrupt 0 Output)—The $\overline{INT0}$ pin is an active low output of the preferred system application that can be used as an interrupt input to a processor. The $\overline{INT0}$ pin can be programmed to be asserted by only Alarm 0 or can be programmed to be asserted by either Alarm 0 or Alarm 1. The $\overline{INT0}$ pin remains low as long as the statue bit causing the interrupt is present and the corresponding interrupt enable bit is set. The $\overline{INT0}$ pin operates when the preferred system application is powered by $V_{CC1}$, $V_{CC2}$, or $V_{BAT}$. The $\overline{INT0}$ pin operates when the preferred system application is powered by $V_{CC1}$, $V_{CC2}$, or $V_{BAT}$. The $\overline{INT0}$ pin is an open drain output and requires an external pull-up resistor.

$\overline{INT1}$ (Interrupt 1 Output)—The $\overline{INT1}$ pin is an active low output of the preferred system application that can be used as an interrupt input to a processor. The $\overline{INT1}$ pin can be programmed to be asserted by alarm 1 only. The $\overline{INT1}$ pin remains low as long as the statue bit causing the interrupt is present and the corresponding interrupt enable bit is set.

The $\overline{INT1}$ pin operates when the preferred system application is powered by $V_{CC1}$, $V_{CC2}$, or $V_{BAT}$. The $\overline{INT1}$ pin operates when the preferred system application is powered by $V_{CC1}$, $V_{CC2}$, or $V_{BAT}$. The $\overline{INT1}$ pin is an open drain output and requires an external pull-up resistor.

$\overline{PF}$ (Power Fall Output)—The $\overline{PF}$ pin is used to indicate loss of the primary power supply ($V_{CC1}$). When $V_{CC1}$ is less than $V_{CC2}$ or is less than $V_{BAT}$, the $\overline{PF}$ pin will be driven low.

X1, X2—Connections for a standard 32.768 KHz quartz crystal, Dalwa part number DS-26S, Seiko part number DS-VT-200, or equivalent. The internal oscillator is designed for operation with a crystal having a specified load capacitance of 6 pF. For more information on crystal selection and crystal layout considerations, please consult Application Note 58, "Crystal Considerations with Dallas Real Time Clocks". The preferred system application can also be driven by an external 32,768 KHz oscillator. In this configuration, the X1 pin is connected to the external oscillator signal and the X2 pin is floated.

RTC and RAM Address Map

The address map for the RTC and RAM registers of the preferred system application is shown in FIG. 11. Data is written to the RTC by writing to address locations 80h to 9Fh and is written to the RAM by writing to address locations A0h to FFh. RTC data is read by reading address locations 00h to 1Fh and RAM data is read by reading address locations 20h to 7Fh.

registers 12h to 1Fh (read) and registers 92h to 9Fh are reserved. These registers will always read 0 regardless of how they are written. The contents of the time, calendar, and alarm registers are in the Binary-Coded Decimal (BCD) format.

The preferred system application can be run in either 12-hour or 24-hour mode. Bit 6 o the hours register is defined as the 12-or 24-hour mode select bit. When high, the 12-hour mode is selected. In the 12-hour mode, bit 5 is the AM/PM bit with logic high being PM. In the 24-hour mode, bit 5 is the second 10 hour bit (20–23 hours).

The preferred system application contains two time of day alarms. Time of Day Alarm 0 can be set by writing to resisters 87h to 8Ah. Time of Day Alarm 1 can be set by writing to registers 8Bh to 8Eh. The alarms can be programmed (by the INTCN bit of the Control Register) to operate in two different modes—each alarm can drive its own separate interrupt output or both alarms can drive a common interrupt output. Bit 7 of each of the time of day alarm registers are mask bits (Table 1). When all of the mask bits are logic 0, a time of day alarm will only occur once per week when the values stored in timekeeping registers 00h to 03h match the values stored in the time of day alarm registers. An alarm will be generated every day when bit 7 of the day alarm register is set to a logic 1. An alarm will be generated every hour when bit 7 of the day and hour alarm registers is set to a logic 1. Similarly, an alarm will be generated every minute when bit 7 of this day, hour, and minute alarm registers is set to a logic 1. When bit 7 of the day, hour, minute, and seconds alarm registers is set to a logic 1, alarm will occur every second.

TABLE 1

TIME OF DAY ALARM MASK BITS

| ALARM REGISTER MASK BITS (BIT 7) | | | | |
|---|---|---|---|---|
| SECONDS | MINUTES | HOURS | DAYS | |
| 1 | 1 | 1 | 1 | Alarm once per second |
| 0 | 1 | 1 | 1 | Alarm when seconds match |
| 0 | 0 | 1 | 1 | Alarm when minutes and second match |
| 0 | 0 | 0 | 1 | Alarm when hours, minutes, and seconds match |
| 0 | 0 | 0 | 0 | Alarm when day, hours, minutes, and seconds match |

Special Purpose Registers

The preferred system application has three additional registers (Control Register, Status Register, and Trickle Charger Register) that control the real time clock, interrupts, and trickle charger.

| CONTROL REGISTER (READ 0FH, WRITE 8FH) | | | | | | | |
|---|---|---|---|---|---|---|---|
| BIT7 | BIT6 | BIT5 | BIT4 | BIT3 | BIT2 | BIT1 | BIT0 |
| $\overline{EOSC}$ | WP | 0 | 0 | 0 | INTON | AIB1 | AIB0 |

Clock, Calendar, and Alarm

The time and calendar information is obtained by reading the appropriate register bytes. The real time clock registers are illustrated in FIG. 12. The time, calendar, and alarm are set or initialized by writing the appropriate register bytes. Note that some bits are set to zero. These bits will always read 0 regardless of how they are written. Also note that $\overline{EOSC}$ (Enable oscillator)—This bit when set to logic 0 will start the oscillator. When this bit is set to a logic 1, the oscillator is stopped and the preferred system application is placed into a low-power standby mode with a current drain of less than 100 nanoamps when power is supplied by $V_{BAT}$ or $V_{CC2}$.

(Write Protect)—Before any write operation to the clock or RAM, but bit must be logic 0. When high, the write protect bit prevents a write operation to any other register and the WP bit is the only bit in the control register that can be written.

INTCN (Interrupt Control)—This bit controls the relationship between the two time of day alarms and the interrupt output pins. When the INTCN bit is set to a logic 1, a match between the timekeeping registers and the Alarm 0 registers will activate the $\overline{INT0}$ pin (provided that the alarm is enabled) and a match between the timekeeping registers and the Alarm 1 registers will activate the $\overline{INT1}$ pin (provided that the alarm is enabled). When the INTCN bit is set to a logic 0, a match between the timekeeping registers and either Alarm 0 or Alarm 1 will activate the $\overline{INT0}$ pin (provided that the alarms are enabled). $\overline{INT1}$ has no function when INTCN is set to a logic 0.

AIE0 (Alarm Interrupt Enable 0)—When set to a logic 1, this bit permits the Interrupt 0 Request Flag (IRQF0) bit in the status register to assert $\overline{INT0}$. When the AIE0 bit is set to logic 0, the IRQF0 bit does not initiate the $\overline{INT0}$ signal.

AIE1 (Alarm Interrupt Enable 1)—When set to a logic 1, this bit permits the Interrupt 1 Request Flag (IRQF1) bit in the status register to assert $\overline{INT1}$ (when INTCN=1) or to assert $\overline{INT0}$ (when INTCN-0). When the AIE1 bit set to logic 0, the IRQF1 bit does not initiate an interrupt signal.

| STATUS REGISTER (READ 10H) | | | | | | | |
|---|---|---|---|---|---|---|---|
| BIT7 | BIT6 | BIT5 | BIT4 | BIT3 | BIT2 | BIT1 | BIT0 |
| 0 | 0 | 0 | 0 | 0 | 0 | IRQF1 | IRQF0 |

IRQF0 (Interrupt 0 Request Flat)—A logic 1 in the Interrupt Request Flag bit indicates that the current time has matched the Alarm 0 registers. If the AIE0 bit is also a logic 1, the $\overline{INT0}$ pin will go low. IRQF0 is cleared when any of the Alarm 0 registers are read or written.

IRQF1 (Interrupt 1 Request Flat)—A logic 1 in the Interrupt Request Flag bit indicates that the current time has matched the Alarm 1 registers. This flag can be used to generate an interrupt on either $\overline{INT0}$ or $\overline{INT1}$ depending on the status of the INTCN bit in the Control Register. If the INTCN bit is set to a logic 1 and IRQF1 is at a logic 1 (and AIE1 bit is also a logic 1), the $\overline{INT1}$ pin will go low. If the INTCN bit is set to a logic 0 and IRQF1 is at a logic 1 (and AIE0 bit is also a logic 1), the $\overline{INT0}$ pin will go low. IRQF1 is cleared when any of the Alarm 1 registers are read or written.

Trickle Charge Registers (Read 11H, Write 91H)

This register controls the trickle charge characteristics of the preferred system application. The simplified schematic of FIG. 1 shows the basic components of the trickle charger. The trickle charge select (TCS) bits (bits 4–7) control the selection of the trickle charger. In order to prevent accidental enabling, only a pattern of 1010 will enable the trickle charger. All other patterns will disable the trickle charger. The preferred system application powers up with the trickle charger disabled. The diode select (DS) bits (bits 2–3) select whether one diode or two diodes are connected between $V_{CC1}$ and $V_{CC2}$. If DS is 01, one diode is selected. If DS is 10, two diodes are selected. If DS is 00 or 11, the trickle charger is disabled independent of TCS. The RS bits select the resistor that is connected between $V_{CC1}$ and $V_{CC2}$. The resistor is selected by the resister select (RS) bits as shown in Table 2.

TABLE 2

| TRICKLE CHARGER RESISTOR SELECT | | |
|---|---|---|
| RS BITS | RESISTOR | TYPICAL VALUE |
| 00 | None | None |
| 01 | R1 | 2KΩ |
| 10 | R2 | 4KΩ |
| 11 | R3 | 8KΩ |

If RS is 00, the trickle charger is disabled independent of TCS.

Diode and resistor selection is determined by the user according to the maximum current desired for battery or super cap charging. The maximum charging current can be calculated as illustrated in the following example. Assume that a system power supply of 5 volts is applied to $V_{CC1}$ and a super cap is connected to $V_{CC2}$. Also assume that the trickle charger has been enabled with 1 diode and resister R1 between $V_{CC1}$ and $V_{CC2}$. The maximum current $I_{MAX}$ would therefore be calculated as follows:

| | |
|---|---|
| $I_{MAX}$ | ~(5.0V − diode drop)/R1 |
| | ~(5.0V−0.7V)/2KΩ |
| | ~2.2mA |

Obviously, as the super cap charges, the voltage drop between $V_{CC1}$ and $V_{CC2}$ will decrease and therefore the charge current will decrease.

Power Control

Power is provided through the $V_{CC1}$, $V_{CC2}$, and $V_{BAT}$ pins. Three different power supply configurations are illustrated in FIGS 6A, 6B, and 6C. Configuration 1 (shown in FIG. 6A) shows the preferred system application being backed up by a non-rechargeable energy source such as a lithium battery. In this configuration, the system power supply is connected to $V_{CC1}$ and $V_{CC2}$ is grounded. The preferred system application will be write protected if $V_{CC1}$ is less than $V_{BAT}$.

Configuration 2 (shown in FIG. 6B) illustrates the preferred system application being backed p by a rechargeable energy source. In this case, the $V_{BAT}$ pin is grounded, $V_{CC1}$ is connected to the secondary supply (the rechargeable energy source). The preferred system application will operate from the larger of $V_{CC1}$ or $V_{CC2}$. When $V_{CC1}$ is greater than $V_{CC1}$+0.2V (typical), $V_{CC1}$ will power the preferred system application. When $V_{CC1}$ is less than $V_{CC2}$, $V_{CC2}$ will power the preferred system application. The preferred system application does not write protect itself in this configuration.

Configuration 3 (shown in FIG. 6C) shows the preferred system application in battery operate mode where the device is powered only by a single battery. In this case, the $V_{CC1}$ and $V_{BAT}$ pins are grounded and the battery is connected to the $V_{OO8}$ pin.

Serial Interface

The preferred system application offers the flexibility to choose between two serial interface modes. The preferred system application can communicate with the SP1 Interface or with a standard 3-wire interface. The interface methods used is determined by the SERMODE pin. When this pin is connected to $V_{CC}$, SPI communication is selected. When this pin is connected to ground, standard 3-wire communication is selected.

Serial Peripheral Interface (SPI)

The serial peripheral interface (SPI) is a synchronous bus for address and data transfer and is sued when interfacing with the SPI bus on specific Motorola™ microcontrollers such as the 66HC05C4and the 68HC11A8. The SPI mode of serial communication is selected by tying the SERMODE pin to $V_{CC}$. Four pins are used for the SPI. The four pins are the SDO (Serial Data Out), SDI (Serial Data In), CE (Chip Enable), and SCLK (Serial Clock). The preferred system application is the slave device in an SPI application, with the microcontroller being the master.

The SDI and SDO pins are the serial data input and output pins for the preferred system application, respectively. The CE input is used to initiate and terminate a data transfer. The SCLK pin is used to synchronize data movement between the master (microcontroller) and the slave (preferred system application) devices.

Figure 13:
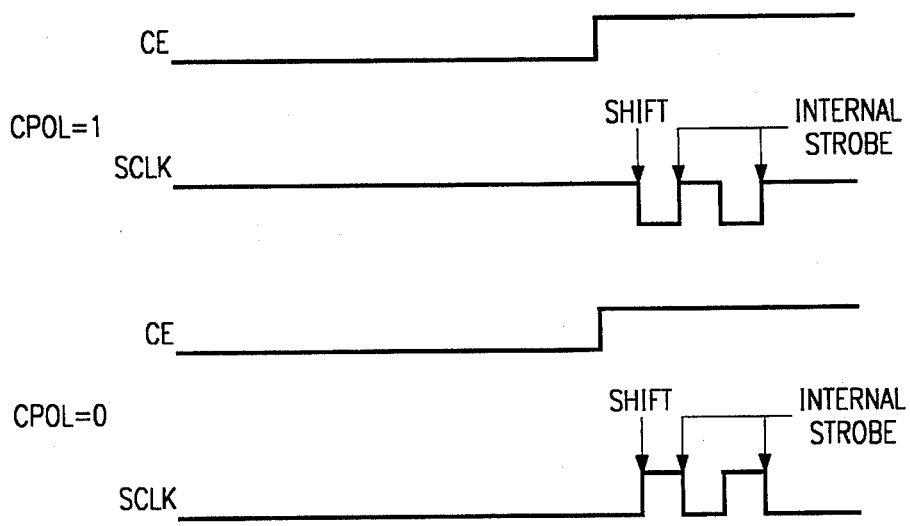
FIG. 13 is a timing diagram highlighting the operation of a serial clock as a function of microcontroller clock polarity (CPOL) of the preferred implementation of the circuitry described above in reference to the general architecture shown in FIG. 5A.

The shift clock (SCLK), which is generated by the microcontroller, is active only during address and data transfer to any device on the SPI bus. The inactive clock polarity is programmable in some microcontrollers. The preferred system application offers an important feature in that the level of the inactive clock is determined by sampling SCLK when CE becomes active. Therefore either SCLK polarity can be accommodated. Input data (SDI) is latched on the internal strobe edge and output data (SDO) is shifted out on the shift edge (see TABLE 3 and FIG. 13). There is one clock for each bit transferred. Address and data bits are transferred in groups of eight.

Address and Data Bytes

Figure 14:
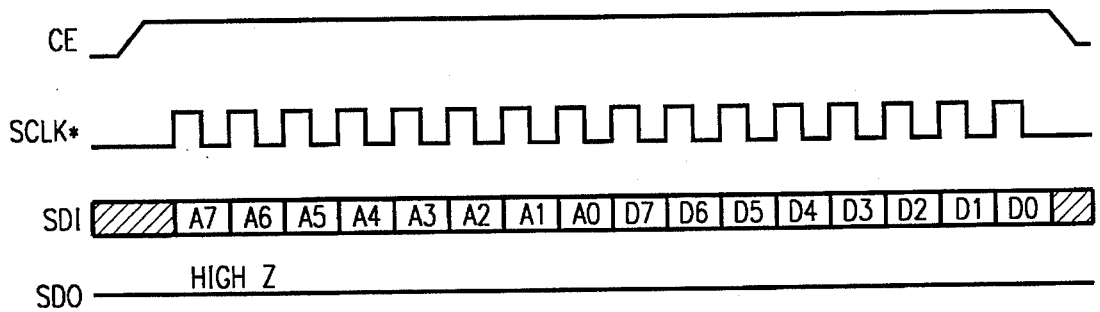
FIG. 14 is timing diagram highlighting the operation of a SPI Single Byte Write of the preferred implementation of the circuitry described above in reference to the general architecture shown in FIG. 5A.
Figure 15:
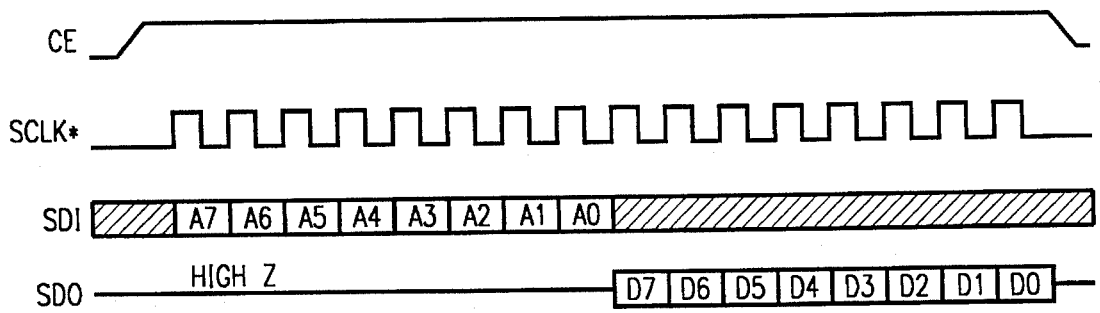
FIG. 15 is timing diagram highlighting the operation of a SPI Single Byte Read of the preferred implementation of the circuitry described above in reference to the general architecture shown in FIG. 5A.
Figure 16:
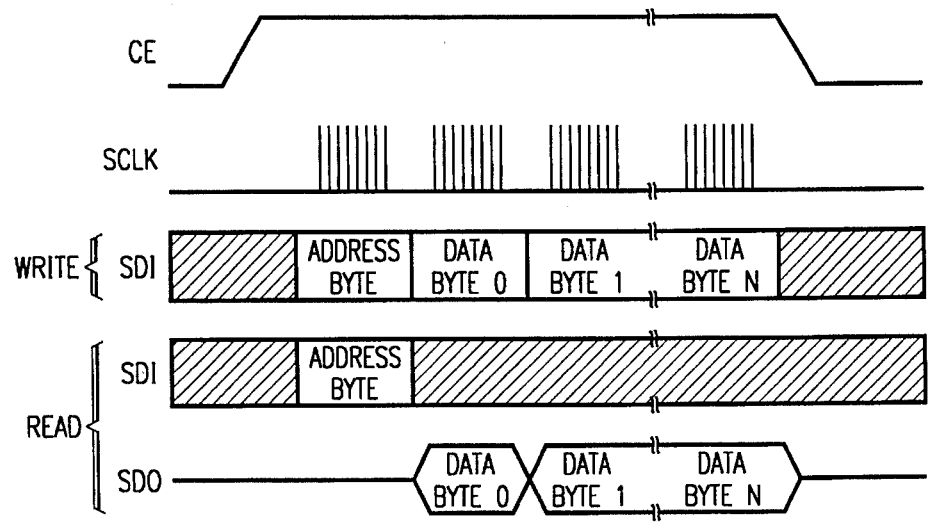
FIG. 16 is timing diagram highlighting the operation of a SPI Multiple Byte Burst Transfer of the preferred implementation of the circuitry described above in reference to the general architecture shown in FIG. 5A.

Address and data bytes are shifted MSB first into the serial data input (SDI) and out of the serial data output (SDO). Any transfer requires the address of the byte to specify a write or read to either a RTC or RAM location, followed by one or more bytes of data. Data is transferred out of the SDO for a read operation and into the SDI for a write operation (see FIGS. 14 and 15). SCLK can be either polarity.

The address byte is always the first byte entered after CE is driven high. The most significant bit (A7) of this byte determines if a read or write will take place. If A7 is 0, one or more read cycles will occur. If A7 is 1, one or more write cycles will occur.

Data transfers can occur one byte at a time or in multiple byte burst mode. After CE is driven high an address is written to the preferred system application. After the address, one or more data bytes can be written or read. For a single byte transfer one byte is read or written and then OE is driven low. For a multiple byte transfer, however, multiple bytes can be read and written to the preferred system application after the address has been written. Each read or write cycle causes the RTC register or RAM address to automatically increment. Incrementing continues until the device is disabled. When the RTC is selected, the address wraps to 00h after incrementing the 1Fh (during a read) and wraps to 80h after incrementing to 8Fh (during a write). When the RAM is selected, the address wraps to 20h after incrementing to 7Fh (during a read) and wraps to A0h after incrementing to FFh (during a write).

3-WIRE INTERFACE

The 3-wire interface mode operates similar to the SPI mode. However, in 3-wire mode there is one I/O instead of separate data in and data out signals. The 3-wire interface consists of the I/O (SDI and SDO pins tied together), CE and SCLK pins. In 3-wire mode, each byte is shifted in LSB first unlike SPI mode where each byte is shifted in MSB first.

Figure 17:
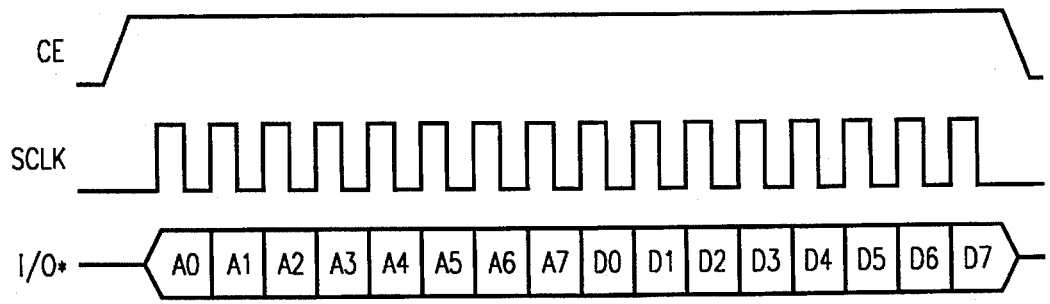
FIG. 17 is timing diagram highlighting the operation of a 3-Wire Single Byte Transfer of the preferred implementation of the circuitry described above in reference to the general architecture shown in FIG. 5A.
Figure 18:
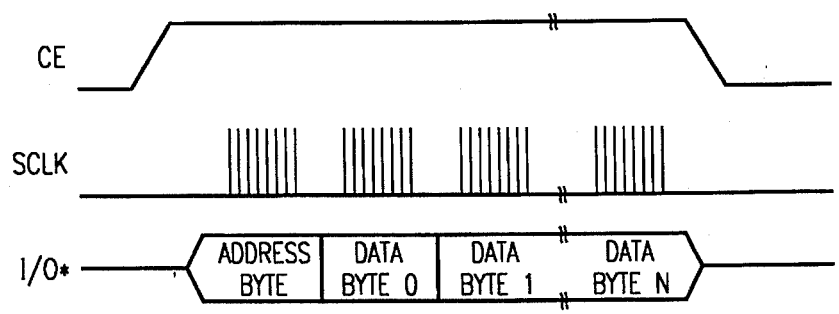
FIG. 18 is timing diagram highlighting the operation of a 3-Wire Multiple Byte Burst Transfer of the preferred implementation of the circuitry described above in reference to the general 20 architecture shown in FIG. 5A.

As is the case with the SPI mode, an address byte is written to the device followed by a single data byte or multiple data bytes. FIG. 17 illustrates a read and write cycle. FIG. 18 illustrates a multiple byte burst transfer. In 3-wire mode, data is input on the rising edge of SCLK and output on the falling edge of SCLK.

Appendix A includes information regarding the absolute maximum ratings, recommended DC operating conditions, DC electrical characteristics, capacitance, AC electrical characteristics, timing diagram: Read Data Transfer, Timing Diagram: Write Data Transfer, additional notes, and additional measurement information on the preferred application in preferred packages shown in FIGS. 4A and 4B.

Further Modifications and Variations

Although the invention has been described with reference to a specific embodiment, this description is not meant to be construed in a limiting sense. As described above, various modifications of the disclosed embodiment as well as alternate embodiments of the invention will become apparent to persons skilled in the art upon reference to the description of the invention. While it is clear from the above discussion, that preferred embodiments implement the disclosed circuitry in an integrated circuit on a monolithic semiconductor substrate (e.g., silicon) portions of the circuitry may be moved "off-chip" depending upon the application and design requirements. Similarly, alternate application circuitry may be coupled to the $V_{DD}$ pin, including alternate timekeeping circuitry or other application circuitry altogether. In addition, it is well within the scope of the invention to extend the number of outputs tied to a single interface supply or any number of outputs tied to any number of interface supplies driving circuits with any number of different supplies of varying voltages. Accordingly, it should be understood that the modifications and variations suggested above are not intended to be exhaustive.

*APPENDIX*

ABSOLUTE MAXIMUM RATINGS*
Voltage on Any Pin Relative to Ground     −0.5V to +7.0V
Operating Temperature     0°C to +70°C
Storage Temperature     −55°C to +125°C
Soldering Temperature     260°C for 10 seconds

* This is a stress rating only and functional operation of the device at these or any other conditions above those indicated in the operation sections of this specification is not implied. Exposure to absolute maximum rating conditions for extended periods of time may affect reliability.

The Dallas Semiconductor DS1305 is built to the highest quality standards and manufactured for long term reliability. All Dallas Semiconductor devices are made using the same quality materials and manufacturing methods. However, standard versions of the DS1305 are not exposed to environmental stresses, such as burn-in, that some industrial applications require. Products which have successfully passed through this series of environmental stresses are marked IND or N, denoting their extended operating temperature and reliability rating. For specific reliability information on this product, please contact the factory in Dallas at (214) 450-0448.

RECOMMENDED DC OPERATING CONDITIONS     (0°C to 70°C*)

| PARAMETER | SYMBOL | | MIN | TYP | MAX | UNITS | NOTES |
|---|---|---|---|---|---|---|---|
| Supply Voltage $V_{CC1}$, $V_{CC2}$ | $V_{CC1}$, $V_{CC2}$ | | 2.5 | | 5.5 | V | 1, 9 |
| Logic 1 Input | $V_{IH}$ | | 2.0 | | $V_{CC}$+0.3 | V | 1 |
| Logic 0 Input | $V_{IL}$ | $V_{CC}$=2.5V | −0.3 | | +0.3 | V | 1 |
| | | $V_{CC}$=5V | −0.3 | | +0.8 | | |
| $V_{BAT}$ Battery Voltage | $V_{BAT}$ | | 2.5 | | 5.5 | V | 1 |
| $V_{CCIF}$ Supply Voltage | $V_{CCIF}$ | | 2.5 | | 5.5 | V | 14 |

DC ELECTRICAL CHARACTERISTICS     (0°C to +70°C*; $V_{CC}$ = 2.5 to 5.5V**)

| PARAMETER | SYMBOL | | MIN | TYP | MAX | UNITS | NOTES |
|---|---|---|---|---|---|---|---|
| Input Leakage | $I_{LI}$ | | | | +500 | µA | |
| Output Leakage | $I_{LO}$ | | | | 1 | µA | |
| Logic 0 Output | $V_{OL}$ | $V_{CC}$=2.5V | | | 0.4 | V | 2 |
| | | $V_{CC}$=5V | | | 0.4 | | |
| Logic 1 Output | $V_{OH}$ | $V_{CCIF}$=2.5V | 1.6 | | 0.4 | V | 13 |
| | | $V_{CCIF}$=5V | 2.4 | | 0.4 | | |
| $V_{CC1}$ Active Supply Current | $I_{CC1A}$ | $V_{CC1}$=2.5V | | | 0.425 | mA | 4, 10 |
| | | $V_{CC1}$=5V | | | 1.28 | | |
| $V_{CC1}$ Timekeeping Current | $I_{CC1T}$ | $V_{CC1}$=2.5V | | | 25.3 | µA | 3, 10 |
| | | $V_{CC1}$=5V | | | 81 | | |
| $V_{CC1}$ Standby Current | $I_{CC1S}$ | $V_{CC1}$=2.5V | | | 25 | µA | 8, 10 |
| | | $V_{CC1}$=5V | | | 80 | | |
| $V_{CC2}$ Active Supply Current | $I_{CC2A}$ | $V_{CC2}$=2.5V | | | 0.4 | mA | 4, 11 |
| | | $V_{CC2}$=5V | | | 1.2 | | |
| $V_{CC2}$ Timekeeping Current | $I_{CC2T}$ | $V_{CC2}$=2.5V | | | 0.3 | µA | 3, 11 |
| | | $V_{CC2}$=5V | | | 1 | | |

* −40°C to 85°C for industrial device
** Unless otherwise noted.

DC ELECTRICAL CHARACTERISTICS (cont'd)    (0°C to +70°C*; $V_{CC}$ = 2.5 to 5.5V**)

| PARAMETER | SYMBOL | | MIN | TYP | MAX | UNITS | NOTES |
|---|---|---|---|---|---|---|---|
| $V_{CC2}$ Standby Current | $I_{CC2S}$ | $V_{CC2}$=2.5V | | | 100 | nA | 8, 11 |
| | | $V_{CC2}$=5V | | | 100 | | |
| Battery Timekeeping Current | $I_{BATT}$ | $V_{BAT}$=3V | | | 300 | nA | 12 |
| Battery Standby Current | $I_{BATS}$ | $V_{BAT}$=3V | | | 100 | nA | 12 |
| Trickle Charge Resistors | R1 | | | 2 | | KΩ | |
| | R2 | | | 4 | | KΩ | |
| | R3 | | | 8 | | KΩ | |
| Trickle Charger Diode Voltage Drop | $V_{TD}$ | | | 0.7 | | V | |

CAPACITANCE    ($t_A$ = 25°C)

| PARAMETER | SYMBOL | CONDITION | TYP | MAX | UNITS | NOTES |
|---|---|---|---|---|---|---|
| Input Capacitance | $C_I$ | | 10 | | pF | |
| Output Capacitance | $C_O$ | | 15 | | pF | |
| Crystal Capacitance | $C_X$ | | 6 | | pF | |

3-WIRE AC ELECTRICAL CHARACTERISTICS    (0°C to 70°C*; $V_{CC}$ = 2.5V to 5.5V**)

| PARAMETER | SYMBOL | | MIN | TYP | MAX | UNITS | NOTES |
|---|---|---|---|---|---|---|---|
| Data to CLK Setup | $t_{DC}$ | $V_{CC}$=2.5V | 200 | | | ns | 5, 6 |
| | | $V_{CC}$=5V | 50 | | | | |
| CLK to Data Hold | $t_{CDH}$ | $V_{CC}$=2.5V | 280 | | | ns | 5, 6 |
| | | $V_{CC}$=5V | 70 | | | | |
| CLK to Data Delay | $t_{CDD}$ | $V_{CC}$=2.5V | | | 800 | ns | 5, 6, 7 |
| | | $V_{CC}$=5V | | | 200 | | |
| CLK Low Time | $t_{CL}$ | $V_{CC}$=2.5V | 1000 | | | ns | 6 |
| | | $V_{CC}$=5V | 250 | | | | |
| CLK High Time | $t_{CH}$ | $V_{CC}$=2.5V | 1000 | | | ns | 6 |
| | | $V_{CC}$=5V | 250 | | | | |
| CLK Frequency | $t_{CLK}$ | $V_{CC}$=2.5V | | | 0.6 | MHz | 6 |
| | | $V_{CC}$=5V | DC | | 2.0 | | |
| CLK Rise and Fall | $t_R$, $t_F$ | $V_{CC}$=2.5V | | | 2000 | ns | |
| | | $V_{CC}$=5V | | | 500 | | |

\* −40°C to 85°C for industrial device
\*\*Unless otherwise noted.

3-WIRE AC ELECTRICAL CHARACTERISTICS (cont'd)     (0°C to 70°C*; $V_{CC}$ = 2.5 to 5.5V**)

| PARAMETER | SYMBOL | | MIN | TYP | MAX | UNITS | NOTES |
|---|---|---|---|---|---|---|---|
| CE to CLK Setup | $t_{CC}$ | $V_{CC}$=2.5V | 4 | | | µs | 6 |
| | | $V_{CC}$=5V | 1 | | | | |
| CLK to CE Hold | $t_{CCH}$ | $V_{CC}$=2.5V | 240 | | | ns | 6 |
| | | $V_{CC}$=5V | 60 | | | | |
| CE Inactive Time | $t_{CWH}$ | $V_{CC}$=2.5V | 4 | | | µs | 6 |
| | | $V_{CC}$=5V | 1 | | | | |
| CE to Output High Z | $t_{CDZ}$ | $V_{CC}$=2.5V | | | 280 | ns | 5, 6 |
| | | $V_{CC}$=5V | | | 70 | | |
| SCLK to Output High Z | $t_{CCZ}$ | $V_{CC}$=2.5V | | | 280 | ns | 5, 6 |
| | | $V_{CC}$=5V | | | 70 | | |

\* –40°C to 85°C for industrial device
\*\*Unless otherwise noted.

TIMING DIAGRAM: 3-WIRE READ DATA TRANSFER

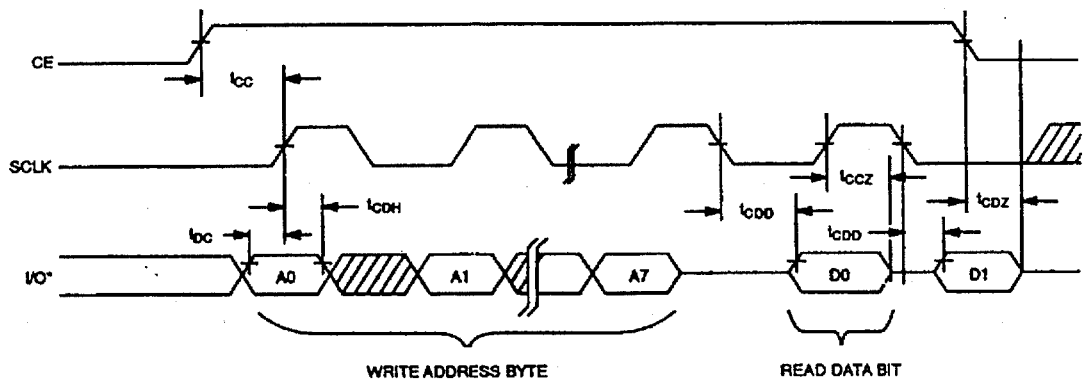

TIMING DIAGRAM: 3-WIRE WRITE DATA TRANSFER

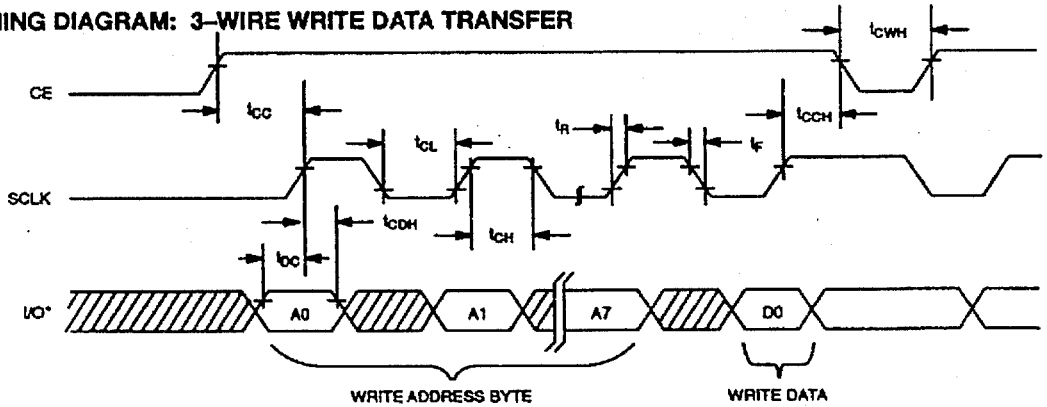

\* I/O is SDI and SDO tied together.

SPI AC ELECTRICAL CHARACTERISTICS (0°C to 70°C*; $V_{CC}$ = 2.5 to 5.5V**)

| PARAMETER | SYMBOL | | MIN | TYP | MAX | UNITS | NOTES |
|---|---|---|---|---|---|---|---|
| Data to CLK Setup | $t_{DC}$ | $V_{CC}$=2.5V | 200 | | | ns | 5, 6 |
| | | $V_{CC}$=5V | 50 | | | | |
| CLK to Data Hold | $t_{CDH}$ | $V_{CC}$=2.5V | 280 | | | ns | 5, 6 |
| | | $V_{CC}$=5V | 70 | | | | |
| CLK to Data Delay | $t_{CDD}$ | $V_{CC}$=2.5V | | | 800 | ns | 5, 6, 7 |
| | | $V_{CC}$=5V | | | 200 | | |
| CLK Low Time | $t_{CL}$ | $V_{CC}$=2.5V | 1000 | | | ns | 6 |
| | | $V_{CC}$=5V | 250 | | | | |
| CLK High Time | $t_{CH}$ | $V_{CC}$=2.5V | 1000 | | | ns | 6 |
| | | $V_{CC}$=5V | 250 | | | | |
| CLK Frequency | $t_{CLK}$ | $V_{CC}$=2.5V | | | 0.6 | MHz | 6 |
| | | $V_{CC}$=5V | DC | | 2.0 | | |
| CLK Rise and Fall | $t_R, t_F$ | $V_{CC}$=2.5V | | | 2000 | ns | |
| | | $V_{CC}$=5V | | | 500 | | |
| CE to CLK Setup | $t_{CC}$ | $V_{CC}$=2.5V | 4 | | | µs | 6 |
| | | $V_{CC}$=5V | 1 | | | | |
| CLK to CE Hold | $t_{CCH}$ | $V_{CC}$=2.5V | 240 | | | ns | 6 |
| | | $V_{CC}$=5V | 60 | | | | |
| CE Inactive Time | $t_{CWH}$ | $V_{CC}$=2.5V | 4 | | | µs | 6 |
| | | $V_{CC}$=5V | 1 | | | | |
| CE to Output High Z | $t_{CDZ}$ | $V_{CC}$=2.5V | | | 280 | ns | 5, 6 |
| | | $V_{CC}$=5V | | | 70 | | |

\* –40°C to 85°C for industrial device
\*\*Unless otherwise noted.

TIMING DIAGRAM: SPI READ DATA TRANSFER
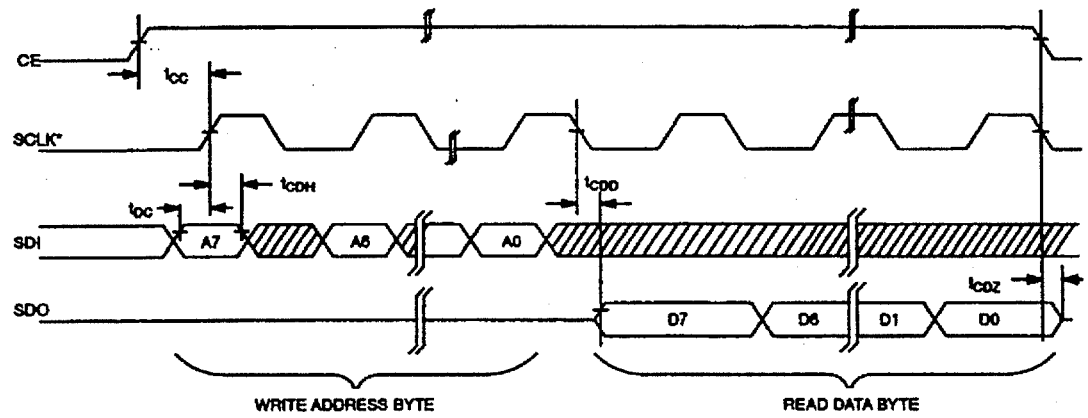
TIMING DIAGRAM: SPI WRITE DATA TRANSFER
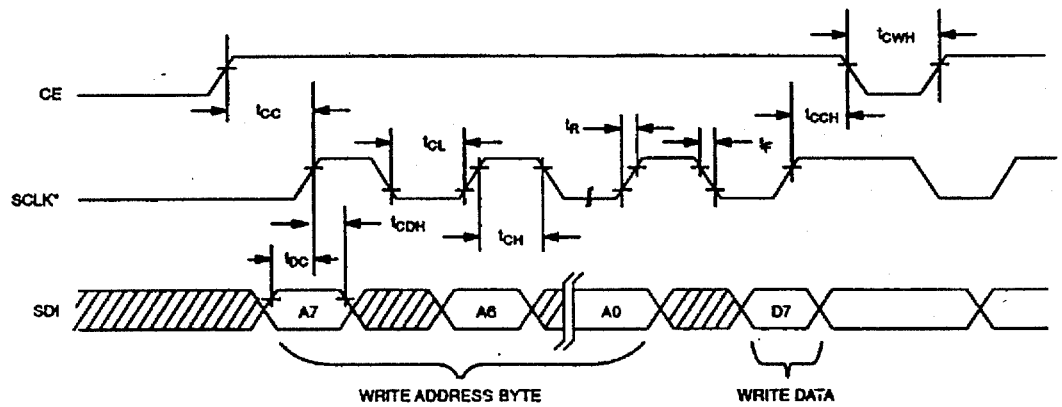
* SCLK can be either polarity

NOTES:

1. All voltages are referenced to ground.

2. Logic zero voltages are specified at a sink current of 4 mA at $V_{CC}=5V$ and 1.5 mA at $V_{CC}=2.5V$, $V_{OL}=GND$ for capacitive loads.

3. $I_{CC1T}$ and $I_{CC2T}$ are specified with CE set to a logic 0 and $\overline{EOSC}$ bit=0 (oscillator enabled).

4. $I_{CC1A}$ and $I_{CC2A}$ are specified with $CE=V_{CC}$, SCLK=2 MHz (0–$V_{CC}$) at $V_{CC}=5V$; SCLK=500 kHz (0–5V) at $V_{CC}=2.5V$ and $\overline{EOSC}$ bit=0 (oscillator enabled).

5. Measured at $V_{IH}=2.0V$ or $V_{IL}=0.8V$ and 10 ms maximum rise and fall time.

6. Measured with 50 pF load.

7. Measured at $V_{OH}=2.4V$ or $V_{OL}=0.4V$.

8. $I_{CC1S}$ and $I_{CC2S}$ are specified with CE set to a logic 0. The $\overline{EOSC}$ bit must be set to logic one (oscillator disabled).

9. $V_{CC}=V_{CC1}$, when $V_{CC1}>V_{CC2}+0.2V$ (typical); $V_{CC}=V_{CC2}$, when $V_{CC2}>V_{CC1}$.

10. $V_{CC2}=0$ volts.

11. $V_{CC1}=0$ volts.

12. $(V_{CC1}=V_{CC2}) < V_{BAT}$.

13. Logic one voltages are specified at a source current of 1 mA at $V_{CC}=5V$ and 0.4 mA at 2.5V, $V_{OH}=V_{CC}$.

14. $V_{CCIF}$ must be less than or equal to the largest of $V_{CC1}$, $V_{CC2}$, and $V_{BAT}$.

DS1305 16-PIN DIP (300 MIL)
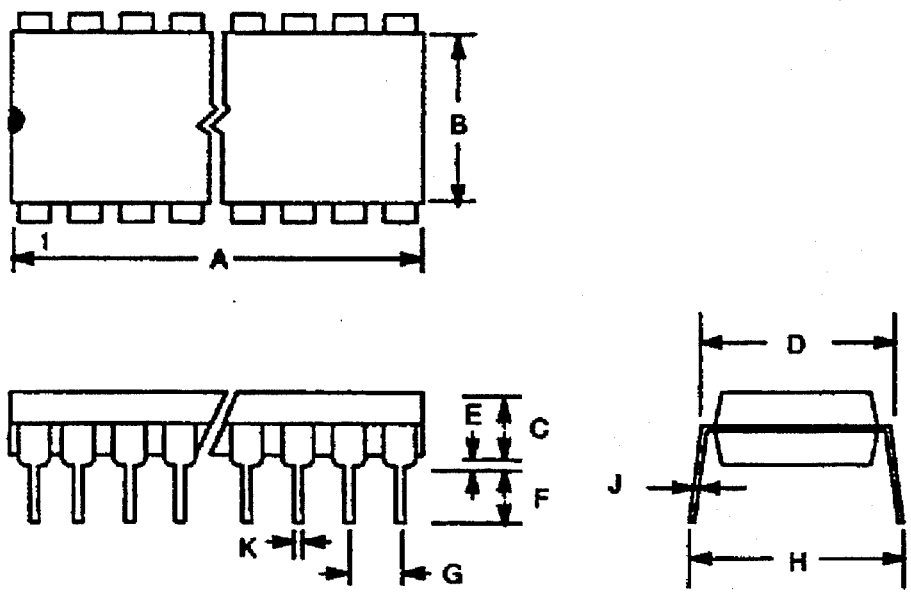
| PKG | 16-PIN | |
|---|---|---|
| DIM | MIN | MAX |
| A IN. | 0.740 | 0.780 |
| MM | 18.80 | 19.81 |
| B IN. | 0.240 | 0.260 |
| MM | 6.10 | 6.60 |
| C IN. | 0.120 | 0.140 |
| MM | 3.05 | 3.56 |
| D IN. | 0.300 | 0.325 |
| MM | 7.62 | 8.26 |
| E IN. | 0.015 | 0.040 |
| MM | 0.38 | 1.02 |
| F IN. | 0.120 | 0.140 |
| MM | 3.04 | 3.56 |
| G IN. | 0.090 | 0.110 |
| MM | 2.29 | 2.79 |
| H IN | 0.320 | 0.370 |
| MM | 8.13 | 9.40 |
| J IN | 0.008 | 0.012 |
| MM | 0.20 | 0.30 |
| K IN. | 0.015 | 0.021 |
| MM | 0.38 | 0.53 |

We claim:

1. A programmable power controller for controlling power between a primary power source and a secondary power source, said primary power source having a first voltage and said secondary power source having a second voltage, comprising:

(a) a control register having a first field, said first field used to activate circuitry used to select from said primary power source and from said secondary power source;

(b) a logic circuitry to compare said first voltage and said second voltage to determine which is greater and then to couple said primary power source or said secondary power source depending upon which is greater to power said logic circuitry, and a memory;

(c) said memory coupled to said logic circuitry, said memory being read and written to via an input/output buffer; and (d) wherein said logic circuitry activates write protection circuitry to prevent writing to said memory if said secondary power source is powering said logic circuitry and said memory.

2. The programmable power controller of claim 1, wherein said control register also has a second field used to select an electrical path having a first voltage drop that ensures said primary power source will have a higher voltage when said primary power source is active under normal operating conditions.

3. The programmable power controller of claim 2, wherein said electrical path incorporates at least one diode.

4. The programmable power controller of claim 2, wherein said electrical path is selected from a plurality of electrical paths, each electrical path having a different number of diodes.

5. The programmable power controller of claim 4, wherein said plurality of electrical paths comprises a first electrical path and a second electrical path, said first electrical path incorporates a first diode, said second electrical path incorporates a second diode and a third diode.

6. The programmable power controller of claim 2, wherein said second field has a plurality of bits.

7. The programmable power controller of claim 6, wherein said plurality of bits is equal to two bits.

8. The programmable power controller of claim 1, wherein said control register also has a third field used to select an electrical path of a plurality of electrical paths, each electrical path having a variety of voltage drops.

9. The programmable power controller of claim 8, wherein each electrical path of said plurality of electrical paths have a different resistance.

10. The programmable power controller of claim 9, wherein a first electrical path, a second electrical path, and a third electrical path comprise said plurality of electrical paths, said first electrical path having a first resistance, said second electrical path having a second resistance, and a third electrical path having a third resistance.

11. The programmable power controller of claim 10, wherein said first resistance is 2KΩ, said second resistance is 4KΩ, and said third resistance is 8KΩ.

12. The programmable power controller of claim 8, wherein said third field has a plurality of bits.

13. The programmable power controller of claim 12, wherein said plurality of bits is equal to two bits.

14. The programmable power controller of claim 1, wherein said secondary power source is chargeable.

15. The programmable power controller of claim 14, wherein said secondary power source is selected from the group consisting of a capacitor and a rechargeable battery.

16. The programmable power controller of claim 1, wherein said first field comprises a plurality of bits.

17. The programmable power controller of claim 16, wherein said plurality of bits is equal to four bits.

18. The programmable power controller of claim 1, wherein said logic circuitry comprises:

a comparator having a first input electrically coupled to said primary power source and a second input conditionally electrically coupled to said secondary power source and an output coupled to switching circuitry to electrically couple either said primary power source or said secondary power source to said first circuitry.

19. The programmable power controller of claim 18, wherein said logic circuitry comprises:

sensing circuitry to sense whether said secondary power supply is being used as a power source and if said secondary power supply is being used to activate said write protection circuitry.

20. The programmable power controller of claim 1, wherein said primary power source and said secondary power source supplies have different voltage levels and further wherein said primary power source and said secondary power source supplies are electrically coupled to said logic circuitry and said memory via interface circuitry, said interface circuitry comprising buffer circuitry to buffer said logic circuitry and said memory from said first voltage level and said second voltage level and to select either said first voltage level or said second voltage level depending upon which is greater to power said logic circuitry, and said memory.

21. A programmable power controller, comprising (a) first switching circuitry electrically coupled to a primary power source;

(b) second switching circuitry electrically coupled to said second switching circuitry and to a first plurality of conductive paths, each conductive path of said first plurality of conductive paths having a voltage drop that is not equal to any other;

(c) third switching circuitry electrically coupled to said first plurality of conductive paths and to a second plurality of conductive paths, each conductive path of said second plurality of conductive paths having a resistance that is not equal to any other, said second plurality of conductive paths are electrically coupled to a secondary power source;

(d) a control register having a first field, a second field, and a third field, said first field electrically coupled to said first switching circuitry, said second field electrically coupled to said second switching circuitry, and said third field electrically coupled to said third switching circuitry;

(e) a comparator to compare first voltage of said primary power source with a second voltage of said second power source to determine which is greater and then to couple said primary power source of said secondary power source depending upon which is greater to power said logic circuitry and a memory; and (f) said logic circuitry determines whether said primary power source or said secondary power source is powering said logic circuitry and if said secondary power source is powering said logic circuitry and said memory, said logic circuitry activates a write protection circuitry to prevent said memory from being written to, said logic circuitry, being coupled to said memory.

22. The programmable power controller of claim 21, wherein said first field comprises four bits, said second field comprises two bits, and said third field comprises two bits.

* * * * *